United States Patent
Chu et al.

(10) Patent No.: US 11,121,288 B2
(45) Date of Patent: Sep. 14, 2021

(54) PACKAGE STRUCTURE OF LIGHT-EMITTING ELEMENT

(71) Applicant: Lextar Electronics Corporation, Hsinchu (TW)

(72) Inventors: Jung-Tang Chu, Hsinchu (TW); Kun-Yang Hsieh, Hsinchu (TW); Che-Hung Lin, Hsinchu (TW); Yu-Jen Cheng, Hsinchu (TW)

(73) Assignee: Lextar Electronics Corporation, Hsinchu (TW)

( * ) Notice: Subject to any disclaimer, the term of this patent is extended or adjusted under 35 U.S.C. 154(b) by 0 days.

(21) Appl. No.: 16/714,804

(22) Filed: Dec. 16, 2019

(65) Prior Publication Data
US 2020/0227597 A1 Jul. 16, 2020

(30) Foreign Application Priority Data
Jan. 16, 2019 (CN) .......................... 201910040206.X

(51) Int. Cl.
*H01L 33/48* (2010.01)
*G01V 3/08* (2006.01)
*H01L 33/62* (2010.01)
*H01L 33/58* (2010.01)

(52) U.S. Cl.
CPC .............. *H01L 33/486* (2013.01); *G01V 3/08* (2013.01); *H01L 33/58* (2013.01); *H01L 33/62* (2013.01)

(58) Field of Classification Search
CPC ....... H01L 33/486; H01L 33/62; H01L 33/58; H01L 33/483; H01L 33/36; H01L 33/0004; G01V 3/08; G01V 8/10; H01S 5/022; H01S 5/042; H01S 5/02253
See application file for complete search history.

(56) References Cited

U.S. PATENT DOCUMENTS

| 5,974,066 A | 10/1999 | Wu et al. |
| 6,670,599 B2 | 12/2003 | Wagner et al. |
| 7,065,106 B2 | 6/2006 | Aronson |

(Continued)

FOREIGN PATENT DOCUMENTS

| CN | 101923976 A | 12/2010 |
| CN | 106170735 A | 11/2016 |

(Continued)

*Primary Examiner* — Victor A Mandala
(74) *Attorney, Agent, or Firm* — CKC & Partners Co., LLC

(57) ABSTRACT

A package structure of a light-emitting element includes a shell, a first conductive path, a second conductive path, a light-emitting device, a cover, a first light-transmitting sensing electrode, and a second light-transmitting sensing electrode. The shell has a top surface and a bottom surface, and the top surface is recessed toward the bottom surface to form an accommodating space. Each of the first and second conductive paths extends from the top surface to the bottom surface. The light-emitting device is disposed in the accommodating space. The cover is disposed over the shell. The first and second light-transmitting sensing electrodes are disposed on the same surface of the cover, and a capacitance is formed between the first and second light-transmitting sensing electrodes. The first and second light-transmitting sensing electrodes are electrically connected to the first and second conductive paths, respectively.

20 Claims, 21 Drawing Sheets

(56) References Cited

U.S. PATENT DOCUMENTS

| | | |
|---|---|---|
| 7,443,899 B2 | 10/2008 | Ueki |
| 7,957,448 B2 | 6/2011 | Willemin et al. |
| 8,559,107 B2 | 10/2013 | Chann et al. |
| 8,961,578 B2 | 2/2015 | Liu et al. |
| 9,203,523 B2 | 12/2015 | Christensen et al. |
| 9,228,697 B2 | 1/2016 | Schneider et al. |
| 9,985,414 B1 | 5/2018 | Wise |
| 10,038,304 B2 | 7/2018 | Joseph |
| 10,069,275 B1 | 9/2018 | Lee et al. |
| 10,181,701 B2 | 1/2019 | Moench et al. |
| 10,374,390 B2 | 8/2019 | Lee et al. |
| 10,444,331 B1 | 10/2019 | Lee et al. |
| 10,475,937 B1 | 11/2019 | Jones et al. |
| 2011/0187878 A1 | 8/2011 | Mor et al. |
| 2011/0305256 A1 | 12/2011 | Chann et al. |
| 2012/0219256 A1 | 8/2012 | Mccolloch et al. |
| 2013/0163627 A1 | 6/2013 | Seurin et al. |
| 2013/0236997 A1* | 9/2013 | Lee .................. H01L 33/48 438/27 |
| 2014/0111894 A1* | 4/2014 | Schug .................. H05B 45/50 361/56 |
| 2015/0028368 A1* | 1/2015 | Lee .................. F21S 45/49 257/88 |
| 2016/0079478 A1* | 3/2016 | Kong .................. H01L 33/385 257/13 |
| 2017/0035300 A1 | 2/2017 | Watanabe |
| 2017/0141257 A1* | 5/2017 | Tsai .................. H01L 25/167 |
| 2017/0353004 A1 | 12/2017 | Chen et al. |
| 2017/0373543 A1 | 12/2017 | Alpert et al. |
| 2018/0136364 A1 | 5/2018 | Kare et al. |
| 2018/0269366 A1* | 9/2018 | Oku .................. H01L 33/60 |
| 2018/0277724 A1* | 9/2018 | Obuchi .................. H01L 33/42 |
| 2018/0301589 A1 | 10/2018 | Burroughs et al. |
| 2018/0367767 A1 | 12/2018 | MacKinnon |
| 2019/0121141 A1 | 4/2019 | Dykaar |
| 2019/0157531 A1* | 5/2019 | Moon .................. H01L 27/15 |
| 2019/0229495 A1 | 7/2019 | Pierer et al. |
| 2019/0296522 A1 | 9/2019 | Johnson et al. |
| 2019/0331473 A1 | 10/2019 | Johnson et al. |

FOREIGN PATENT DOCUMENTS

| | | |
|---|---|---|
| CN | 106612620 A | 5/2017 |
| CN | 107167936 A | 9/2017 |
| CN | 107608167 A | 1/2018 |
| CN | 108388072 A | 8/2018 |
| CN | 108663872 A | 10/2018 |
| CN | 109151143 A | 1/2019 |
| CN | 109449747 A | 3/2019 |
| WO | 2017/210078 A1 | 12/2017 |

* cited by examiner

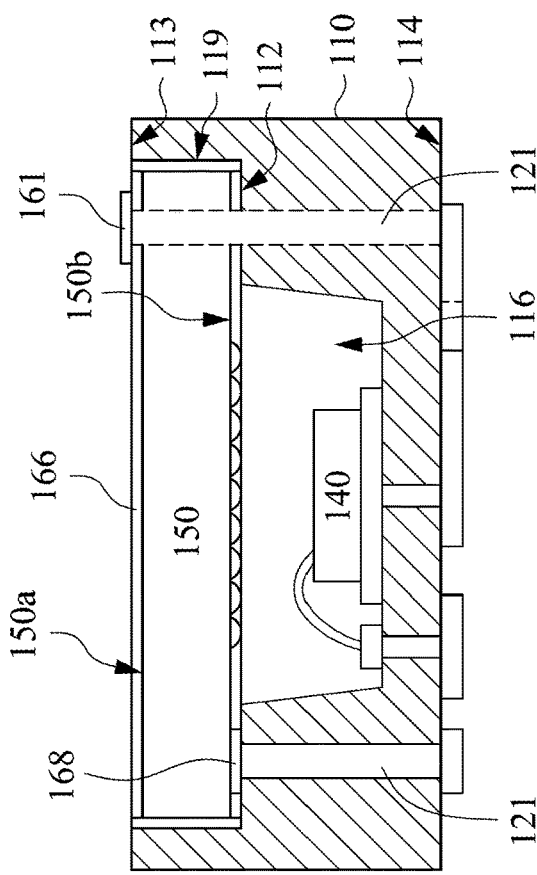
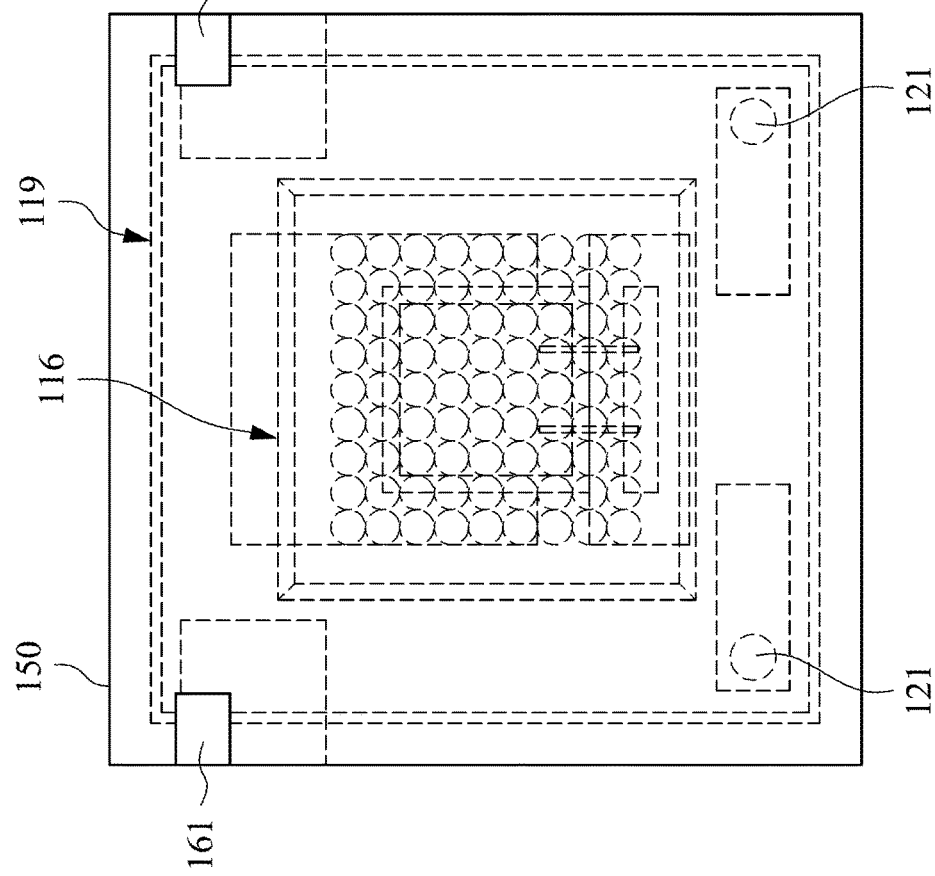
Fig. 13
Fig. 12

PACKAGE STRUCTURE OF LIGHT-EMITTING ELEMENT

CROSS-REFERENCE TO RELATED APPLICATION

This application claims priority to China Application Serial Number 201910040206.X, filed Jan. 16, 2019, which is herein incorporated by reference.

BACKGROUND

Field of Invention

The present disclosure relates to a package structure of light-emitting elements.

Description of Related Art

Light-Emitting Diodes (LEDs), vertical-cavity surface-emitting lasers (VCSELs), etc., are spot light sources that have found common use in recent years, and have many advantages, such as low energy consumption, long life, small size, and fast switching speed.

The current light source is usually divided into a reflective cup body at the bottom and a cover at the top. The two are bonded together through a colloid, and light is emitted from the reflective cup body through the cover. When a foreign object falls on the cover, this can easily affect the brightness and quality of the light. In addition, in the case of long-term use, the cover may be damaged or may peel off. If the light source is applied to facial recognition, such as in a face recognition system in a smart phone, when foreign objects appear on the surface of the cover, the light is shielded and a poor light shape may be formed, thereby resulting in an inaccurate determination. When the cover is broken or peeled off, the infrared light therein may cause harm to human eyes. Therefore, an important issue to be resolved is that related to designing a protection mechanism related to the abnormal condition of the cover.

SUMMARY

Accordingly, an embodiment of the present disclosure provides a package structure of a light-emitting element for detecting whether foreign objects fall on the cover of the light-emitting package structure and detecting whether the cover of the light-emitting package structure is damaged.

One aspect of the present disclosure provides a package structure of a light-emitting element. The package structure of the light-emitting element includes a shell, a first conductive path, a second conductive path, a light-emitting device, a cover, a first light-transmitting sensing electrode, and a second light-transmitting sensing electrode. The shell has a top surface and a bottom surface, and the top surface is recessed toward the bottom surface to form an accommodating space. Each of the first conductive path and the second conductive path extends from the top surface to the bottom surface. The light-emitting device is disposed in the accommodating space. The cover is disposed over the shell. The first light-transmitting sensing electrode and the second light-transmitting sensing electrode are disposed on the same surface of the cover, and a capacitance is formed between the first light-transmitting sensing electrode and the second light-transmitting sensing electrode. The first light-transmitting sensing electrode and the second light-transmitting sensing electrode are electrically connected to the first conductive path and the second conductive path, respectively.

According to some embodiments of the present disclosure, the first light-transmitting sensing electrode and the second light-transmitting sensing electrode are disposed on a lower surface of the cover, and a vertical projection of the first light-transmitting sensing electrode and the second light-transmitting sensing electrode on the cover overlaps with a vertical projection of the light-emitting device on the cover.

According to some embodiments of the present disclosure, the first light-transmitting sensing electrode and the second light-transmitting sensing electrode are disposed on a lower surface of the cover, and the first light-transmitting sensing electrode and the second light-transmitting sensing electrode surround a portion of a periphery of the accommodating space.

According to some embodiments of the present disclosure, the package structure of the light-emitting element further includes a lens array disposed on a lower surface of the cover.

Another aspect of the present disclosure provides a package structure of a light-emitting element. The package structure of the light-emitting element includes a shell, at least one first conductive path, at least one third conductive path, a light-emitting device, a cover, a first light-transmitting sensing electrode, and a second light-transmitting sensing electrode. The shell has a first top surface, a second top surface and a bottom surface. The second top surface is higher than the first top surface. The first top surface is recessed toward the bottom surface to form a first accommodating space and the second top surface is recessed toward the first top surface to form a second accommodating space. The first conductive path extends from the first top surface to the bottom surface. The third conductive path extends from the second top surface to the bottom surface. The light-emitting device is disposed in the first accommodating space. The cover is disposed in the second accommodating space. The first light-transmitting sensing electrode and the second light-transmitting sensing electrode are respectively disposed on opposite surfaces of the cover, and a capacitance is formed between the first light-transmitting sensing electrode and the second light-transmitting sensing electrode. The first light-transmitting sensing electrode and the second light-transmitting sensing electrode are electrically connected to the third conductive path and the first conductive path, respectively.

According to some embodiments of the present disclosure, the first light-transmitting sensing electrode completely covers an upper surface of the cover.

According to some embodiments of the present disclosure, the second light-transmitting sensing electrode is a patterned light-transmitting sensing electrode and is disposed on a lower surface of the cover. The patterned light-transmitting sensing electrode surrounds a portion of a periphery of the first accommodating space.

According to some embodiments of the present disclosure, the second light-transmitting sensing electrode completely covers a lower surface of the cover.

According to some embodiments of the present disclosure, the package structure of the light-emitting element further includes a lens array disposed on the lower surface of the cover. The second light-transmitting sensing electrode completely covers the lower surface of the cover and the lens array.

According to some embodiments of the present disclosure, the package structure of the light-emitting element further includes a lens array disposed on a lower surface of the cover. The second light-transmitting sensing electrode completely covers the lower surface of the cover and the second light-transmitting sensing electrode is disposed between the cover and the lens array.

According to some embodiments of the present disclosure, the package structure of the light-emitting element further includes at least one conductive sheet disposed on the second top surface. The conductive sheet contacts the first light-transmitting sensing electrode and the third conductive path.

Yet another aspect of the present disclosure provides a package structure of a light-emitting element. The package structure of the light-emitting element includes a shell, a first conductive path, a second conductive path, a light-emitting device, a cover, and a light-transmitting conductive unit. The shell has a top surface and a bottom surface. The top surface is recessed toward the bottom surface to form an accommodating space. Each of the first conductive path and the second conductive path extends from the top surface to the bottom surface. The light-emitting device is disposed in the accommodating space. The cover is disposed over the light-emitting device. The light-transmitting conductive unit is disposed on the cover. The first conductive path and the second conductive path are electrically connected to the light-transmitting conductive unit.

According to some embodiments of the present disclosure, the package structure of the light-emitting element further includes a lens array disposed on a lower surface of the cover. The light-transmitting conductive unit completely covers the lower surface of the cover and the light-transmitting conductive unit is disposed between the cover and the lens array.

According to some embodiments of the present disclosure, the package structure of the light-emitting element further includes a lens array disposed on a lower surface of the cover. The light-transmitting conductive unit completely covers the lower surface of the cover and the lens array.

According to some embodiments of the present disclosure, the light-transmitting conductive unit is a patterned conductive unit and is disposed on a lower surface of the cover. The patterned conductive unit surrounds a portion of a periphery of the accommodating space.

According to some embodiments of the present disclosure, the package structure of the light-emitting element further includes a lens array disposed on the lower surface of the cover. The patterned conductive unit surrounds a portion of a periphery of the lens array.

According to some embodiments of the present disclosure, the accommodating space includes a first accommodating space and a second accommodating space. The second accommodating space is located on the first accommodating space, and a width of the second accommodating space is greater than a width of the first accommodating space.

According to some embodiments of the present disclosure, the light-emitting device is disposed in the first accommodating space and the cover is disposed in the second accommodating space.

According to some embodiments of the present disclosure, the light-transmitting conductive unit completely covers an upper surface of the cover and a top surface of the light-transmitting conductive unit is substantially level with the top surface of the shell.

According to some embodiments of the present disclosure, the package structure of the light-emitting element further includes a first conductive sheet and a second conductive sheet disposed on the top surface of the shell. The first conductive sheet contacts the light-transmitting conductive unit and the first conductive path, and the second conductive sheet contacts the light-transmitting conductive unit and the second conductive path.

In the foregoing embodiments, the present disclosure provides a package structure of a light-emitting element, which can detect whether an abnormal situation occurs in the cover. The cover is provided with a capacitance formed by the first light-transmitting sensing electrode and the second light-transmitting sensing electrode, and the capacitance connects the first conductive path and the second conductive path to form a loop. With this design, it is possible to detect whether foreign objects fall on the cover, and whether the cover is broken. In addition, the cover may have a non-closed conductive pattern, and the non-closed conductive pattern connects the first conductive path and the second conductive path to form a loop, thereby detecting a voltage or resistance change of the loop to control the switch of the light-emitting device. That is to say, after the package structure of the light-emitting element provided by the present disclosure is electrically connected to a driving module, when it is detected that foreign objects have fallen on the cover or that the cover is broken or peeled off, the switch of the light-emitting device will be turned off so that the light source does not emit light in such a state. As a result, abnormal functioning of the device to which the package structure is applied, as well as damage to human eyes, can be avoided.

It is to be understood that both the foregoing general description and the following detailed description are by examples, and are intended to provide further explanation of the invention as claimed.

BRIEF DESCRIPTION OF THE DRAWINGS

The disclosure can be more fully understood by reading the following detailed description of the embodiment, with reference made to the accompanying drawings as follows:

FIG. 12 is a top view illustrating the package structure of the light-emitting element according to FIG. 11.

FIG. 13 is a side view illustrating the package structure of the light-emitting element according to FIG. 11.

DETAILED DESCRIPTION

The present disclosure is described by the following specific embodiments. Those with ordinary skill in the art can readily understand the other advantages and functions of the present disclosure after reading the disclosure of this specification. The present disclosure can also be implemented with different embodiments. Various details described in this specification can be modified based on different viewpoints and applications without departing from the scope of the present disclosure.

The following embodiments are disclosed with accompanying diagrams for detailed description. For illustration clarity, many details of practice are explained in the following descriptions. However, it should be understood that these details of practice do not intend to limit the present disclosure. That is, these details of practice are not necessary in parts of embodiments of the present disclosure. Furthermore, for simplifying the drawings, some of the conventional structures and elements are shown with schematic illustrations.

Figure 1:
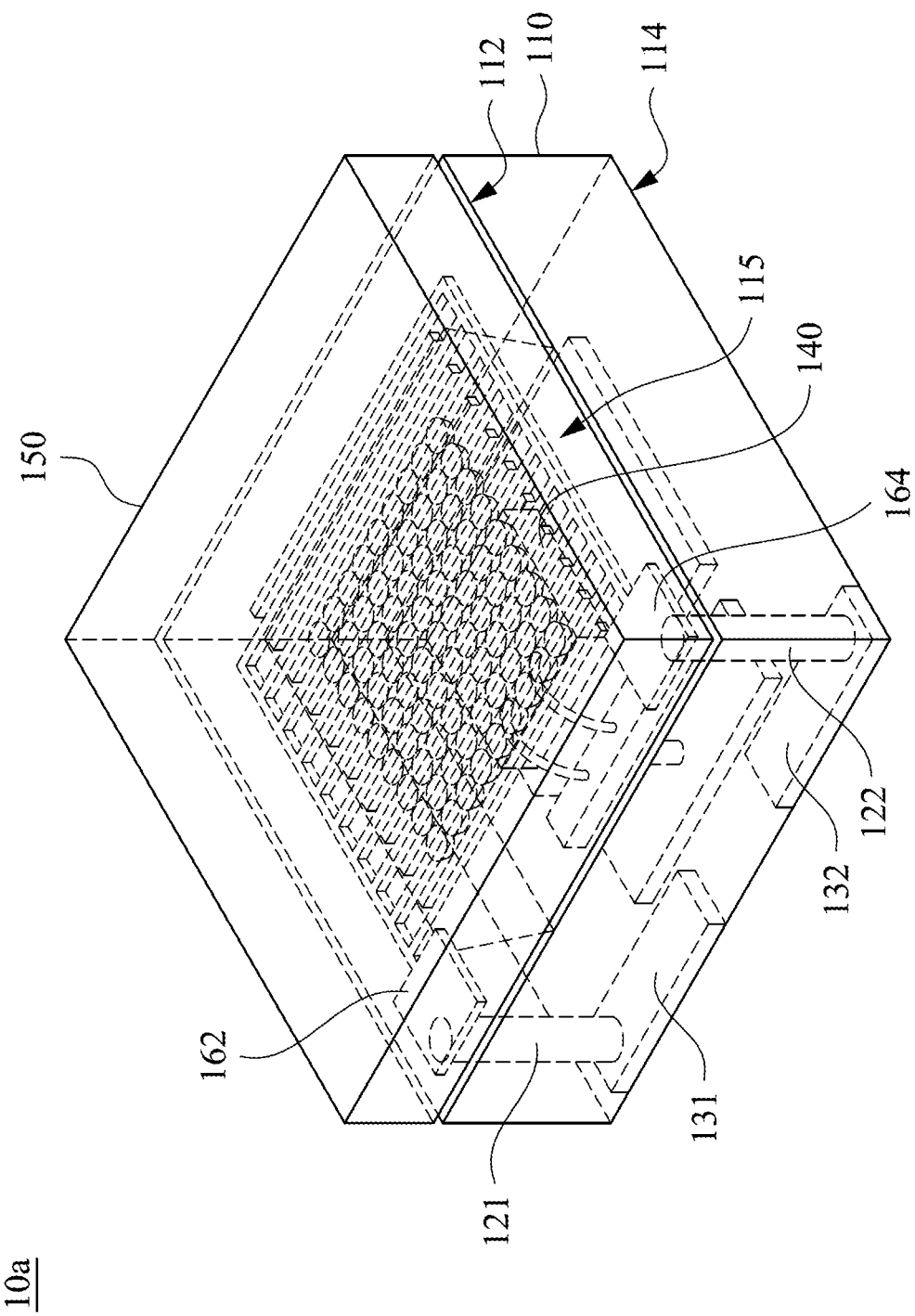
FIG. 1 is a perspective view illustrating a package structure of a light-emitting element, in accordance with one embodiment of the present disclosure.
Figure 3:
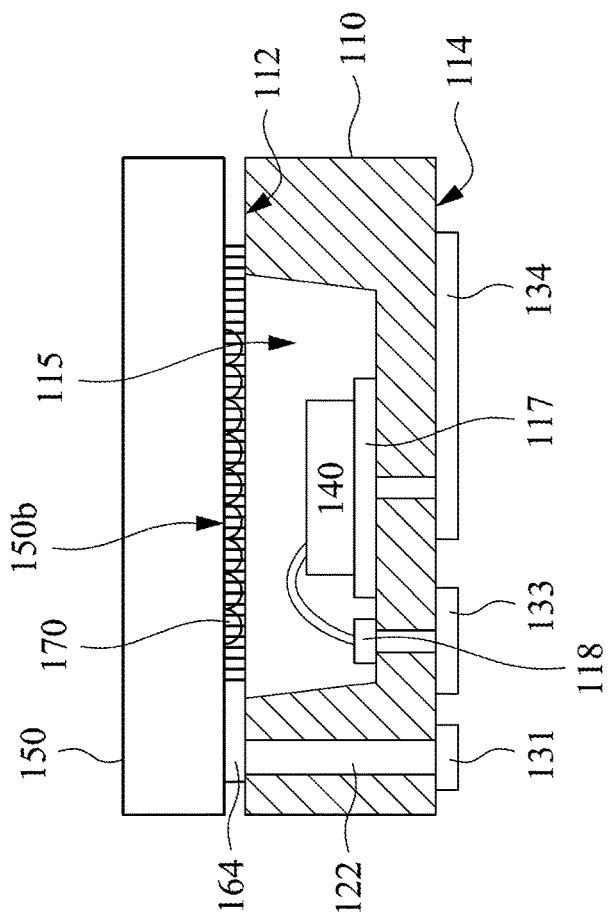
FIG. 3 is a side view illustrating the package structure of the light-emitting element according to FIG. 1.
Figure 2:
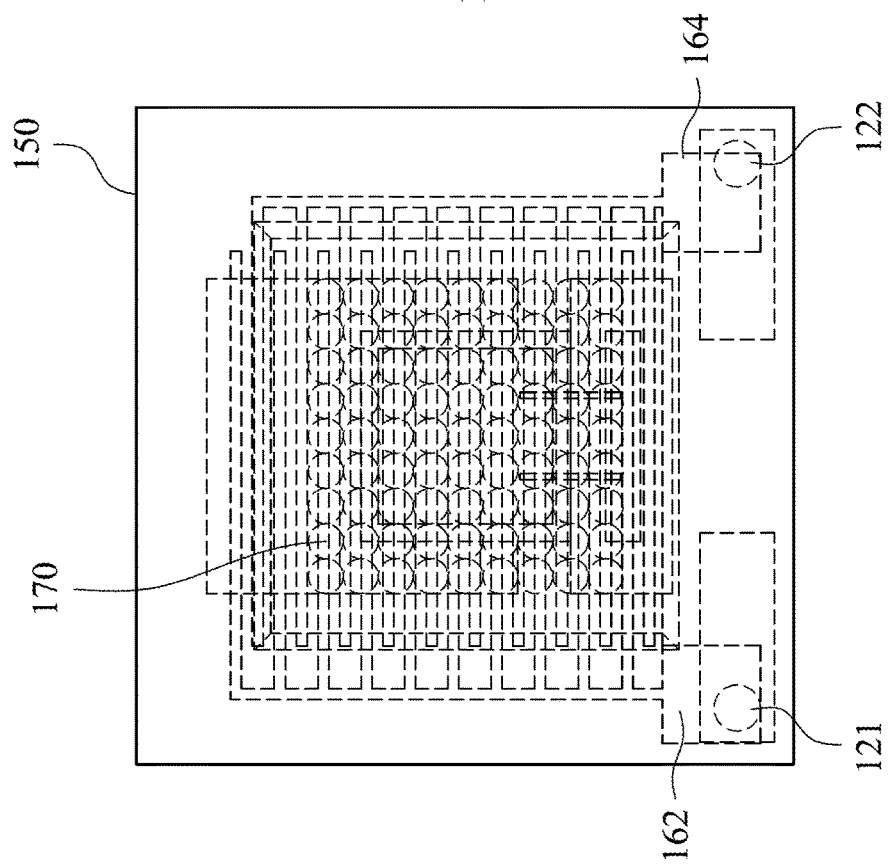
FIG. 2 is a top view illustrating the package structure of the light-emitting element according to FIG. 1.

FIG. 1 is a perspective view illustrating a package structure of a light-emitting element 10a, in accordance with one embodiment of the present disclosure. FIG. 2 is a top view illustrating the package structure of the light-emitting element 10a according to FIG. 1. FIG. 3 is a side view illustrating the package structure of the light-emitting element 10a according to FIG. 1. Referring to FIG. 1 through FIG. 3, the package structure of the light-emitting element 10a includes a shell 110, a first conductive path 121, a second conductive path 122, a light-emitting device 140, a cover 150, a first light-transmitting sensing electrode 162, and a second light-transmitting sensing electrode 164. Specifically, the shell 110 has a top surface 112 and a bottom surface 114, and the top surface 112 is recessed toward the bottom surface 114 to form an accommodating space 115. In various examples, a top view pattern of the accommodating space 115 may be circular, elliptical, or rectangular, but not limited thereto. In some embodiments, the shell 110 is made of insulating materials or high reflective materials. In some embodiments, a reflective layer may be selectively disposed on the sidewall of the accommodating space 115 to enhance the light-emitting effect of the shell 110.

In some embodiments, the shell 110 may further include a first conductive pad 131, a second conductive pad 132, a third conductive pad 133, and a fourth conductive pad 134 which are respectively disposed in different positions of the bottom surface 114 of the shell 110. Further, the first conductive pad 131, the second conductive pad 132, the third conductive pad 133, and the fourth conductive pad 134 may protrude from the bottom surface 114 of the shell 110. The first conductive pad 131, the second conductive pad 132, the third conductive pad 133, and the fourth conductive pad 134 may be formed on the bottom surface 114 of the shell 110 by, for example, molding, attaching, or plating. In other embodiments, the first conductive pad 131, the second conductive pad 132, the third conductive pad 133, and the fourth conductive pad 134 may also be level with the bottom surface 114 and be embedded in the shell 110. The first conductive pad 131, the second conductive pad 132, the third conductive pad 133, and the fourth conductive pad 134 may be buried in the bottom surface 114 of the shell 110 by, for example, injection molding.

In some embodiments, the shell 110 may further include a first conductive block 117 and a second conductive block 118 each disposed on a bottom surface of the accommodating space 115. The first conductive block 117 is electrically connected to the fourth conductive pad 134 and the second conductive block 118 is electrically connected to the third conductive pad 133.

Each of the first conductive path 121 and the second conductive path 122 extends from the top surface 112 to the bottom surface 114 of the shell 110. In this embodiment, the first conductive path 121 and the second conductive path 122 are linear conductors and are embedded in the shell 110. For example, the first conductive path 121 and the second conductive path 122 may be formed by filling conductive materials after a space of conductive lines in the shell 110 is preformed, thereby allowing the linear first conductive path 121 and the second conductive path 122 to be buried in the shell 110. The method of preforming the space of the conductive lines may involve drilling, lamination, or other means. In other embodiments, the first conductive path 121 and the second conductive path 122 may be sheet-shaped conductors and extend toward the bottom surface along the sidewall surface of the accommodating space 115, for example, by electroplating, pasting metal sheets, or coating conductive colloid. In some embodiments, the first conductive path 121 is electrically connected to the first conductive pad 131 and the second conductive path 122 is electrically connected to the second conductive pad 132.

The light-emitting device 140 is disposed in the accommodating space 115. In various embodiments, the light-emitting device 140 may be a vertical-cavity surface-emitting laser or a light-emitting diode, for example. In some embodiments, the light-emitting device 140 may be disposed on the first conductive block 117 and connected to the second conductive block 118 through a wire by a wire bonding configuration. In other embodiments, the light-emitting device 140 may be electrically connected to the first conductive block 117 and the second conductive block 118 by a flip chip configuration. In this embodiment, the light-emitting device 140 is electrically connected to the first conductive block 117 and the second conductive block 118 to form a loop.

The cover 150 is disposed over the shell 110. In some embodiments, the cover 150 is made of insulating materials. In various embodiments, the shell 110 and the cover 150 may be joined by soldering, adhesive bonding (such as silver paste), or mechanical fastening (such as mortise and tenon).

The first light-transmitting sensing electrode 162 and the second light-transmitting sensing electrode 164 are disposed on the same surface of the cover 150, and a capacitance is formed between the first light-transmitting sensing electrode 162 and the second light-transmitting sensing electrode 164. The first light-transmitting sensing electrode 162 and the second light-transmitting sensing electrode 164 are electrically connected to the first conductive path 121 and the second conductive path 122, respectively. After the package structure of the light-emitting element is electrically connected to a driving module (not shown), when a foreign object (such as water drop) appears on the surface of the cover 150, the capacitance value between the first light-transmitting sensing electrode 162 and the second light-transmitting sensing electrode 164 changes accordingly, thereby detecting an abnormal condition on the surface of the cover 150. In addition, when the cover 150 is broken or peeled off in any direction, the capacitance value is also changed, thereby preventing the light source from continuing to emit light in a state where the cover 150 is broken or peeled off. Therefore, such a design can effectively detect an abnormality of the cover 150, avoid erroneous determinations, and ensure the safety of the light-emitting device 140 to avoid harm to human eyes. In various embodiments, the light-transmitting sensing electrode 162 and 164 may include indium tin oxide (ITO), indium zinc oxide (IZO), aluminum-doped zinc oxide (AZO), or materials having a light-transmitting conductive effect.

Figure 4:
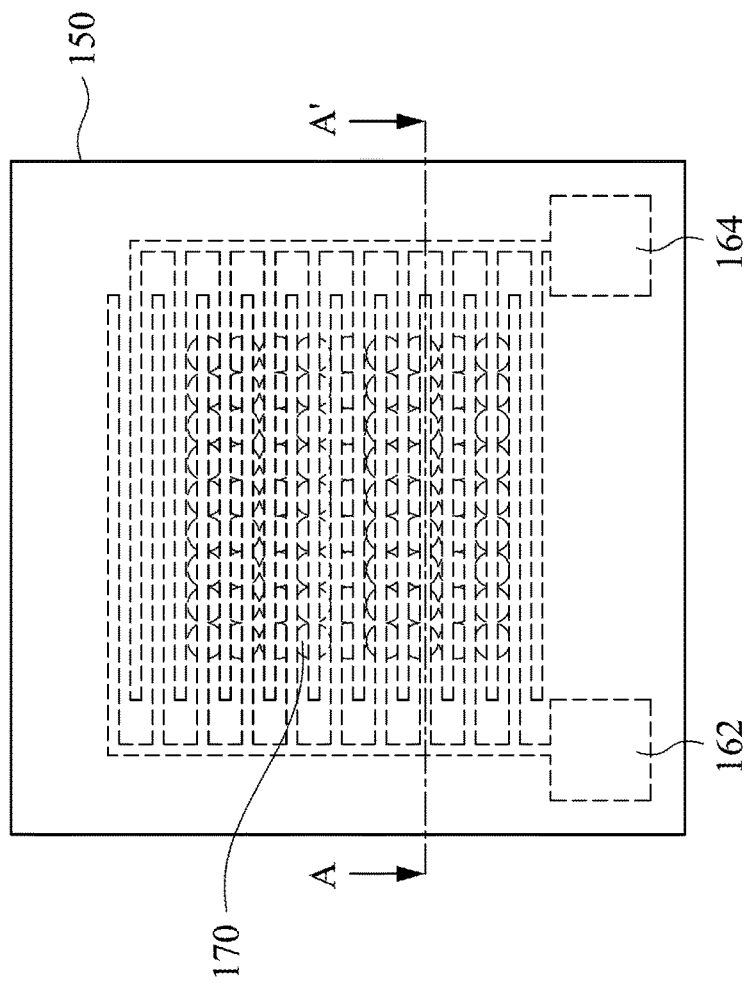
FIG. 4 is a top view of a cover according to FIG. 1.
Figure 5:
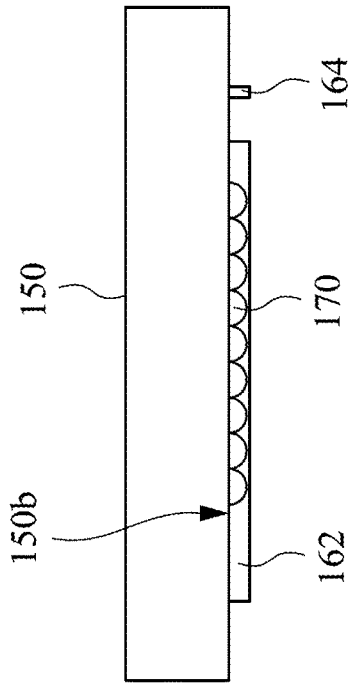
FIG. 5 is a cross-sectional view taken along line A-A' in FIG. 4.

FIG. 4 is a top view of the cover 150 according to FIG. 1. FIG. 5 is a cross-sectional view taken along line A-A' in FIG. 4. Referring to FIG. 4 and FIG. 5, the first light-transmitting sensing electrode 162 and the second light-transmitting sensing electrode 164 present a comb structure that intersect each other in the top view. In other embodiments, the first light-transmitting sensing electrode 162 and the second light-transmitting sensing electrode 164 may each have a comb structure of different length, thickness, or meandering design. With reference to FIG. 1, FIG. 4, and FIG. 5, in this embodiment, the first light-transmitting sensing electrode 162 and the second light-transmitting sensing electrode 164 are disposed on the lower surface 150b of the cover 150, and a vertical projection of the first light-transmitting sensing electrode 162 and the second light-transmitting sensing electrode 164 on the cover 150 overlaps with a vertical projection of the light-emitting device 140 on the cover 150. This design can effectively and accurately determine whether the cover 150 has any foreign objects that have fallen thereon or has any damage abnormality. In some embodiments, the package structure of the light-emitting element 10a further includes a lens array 170 disposed on a lower surface 150b of the cover 150. The lens array 170 can be used to change the angle of the light and improve the uniformity of the light. More specifically, the vertical projection of the first light-transmitting sensing electrode 162 and the second light-transmitting sensing electrode 164 on the cover 150 overlaps with a vertical projection of the lens array 170 on the cover 150. In one embodiment, the first light-transmitting sensing electrode 162 and the second light-transmitting sensing electrode 164 are disposed between the lens array 170 and the cover 150. In another embodiment, the lens array 170 is disposed between the first light-transmitting sensing electrode 162 and the second light-transmitting sensing electrode 164 and the cover 150.

Figure 6:
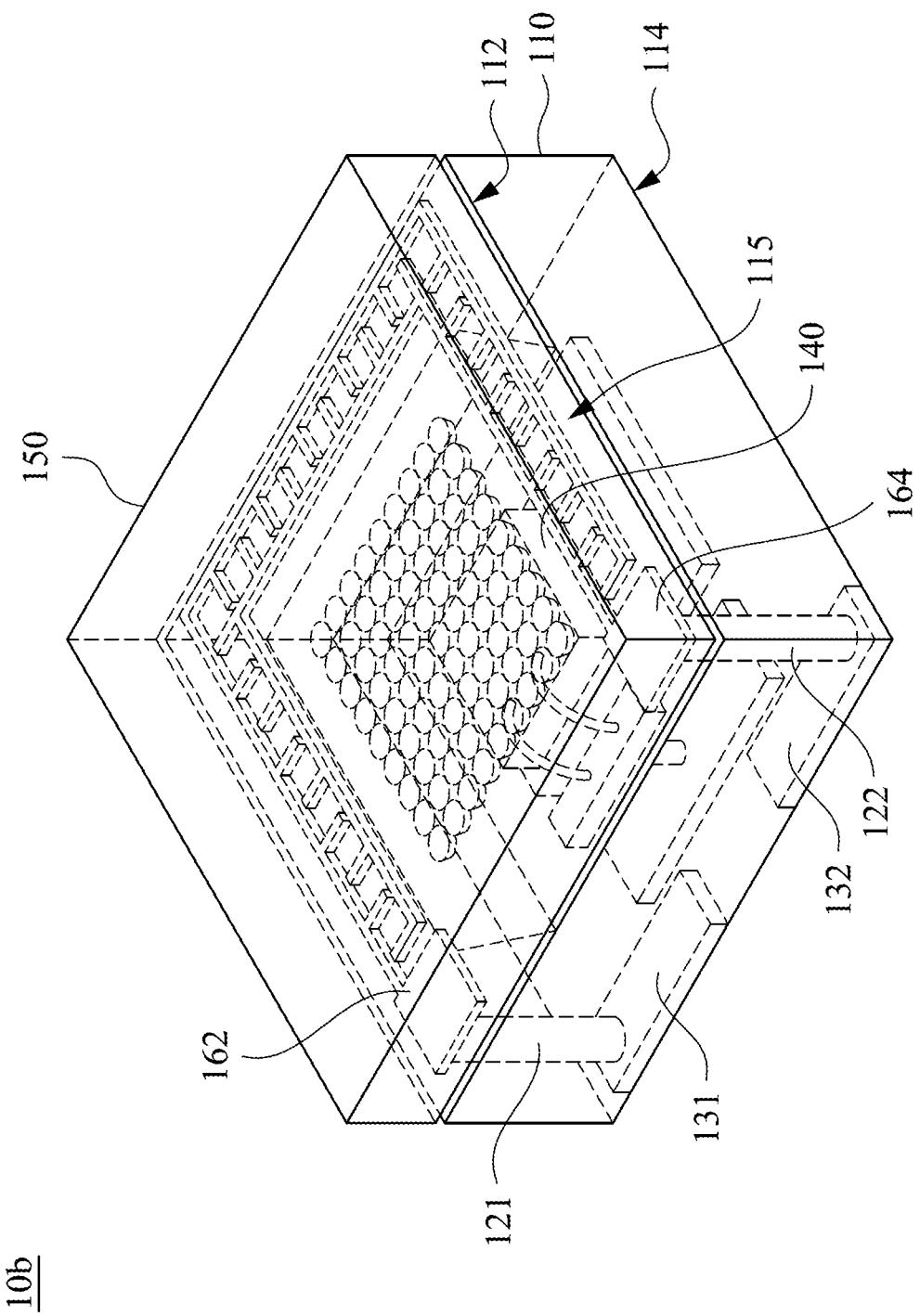
FIG. 6 is a perspective view illustrating a package structure of a light-emitting element, in accordance with various embodiments of the present disclosure.
Figures 7, 8:
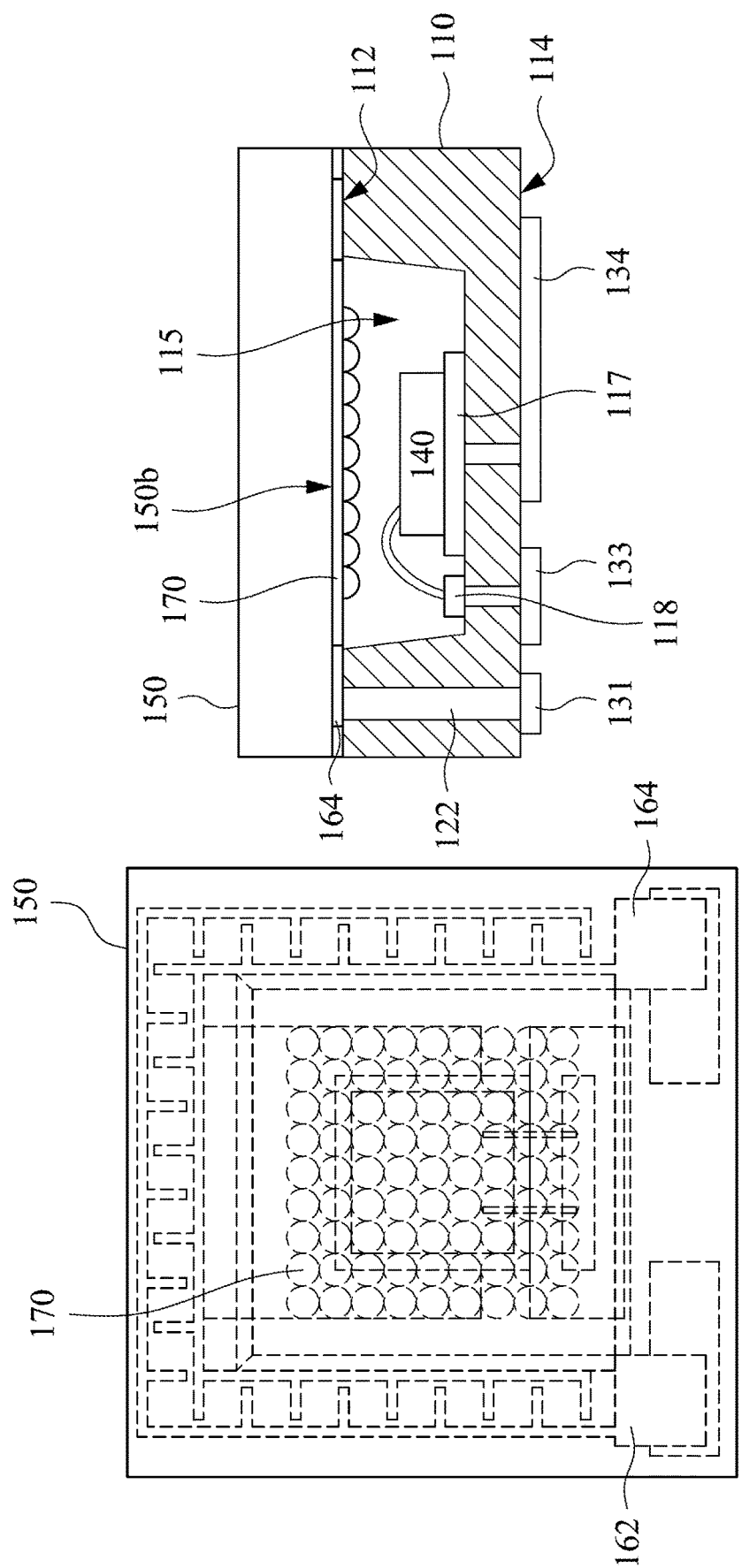
FIG. 7 is a top view illustrating the package structure of the light-emitting element according to FIG. 6.
FIG. 8 is a side view illustrating the package structure of the light-emitting element according to FIG. 6.
Figure 9:
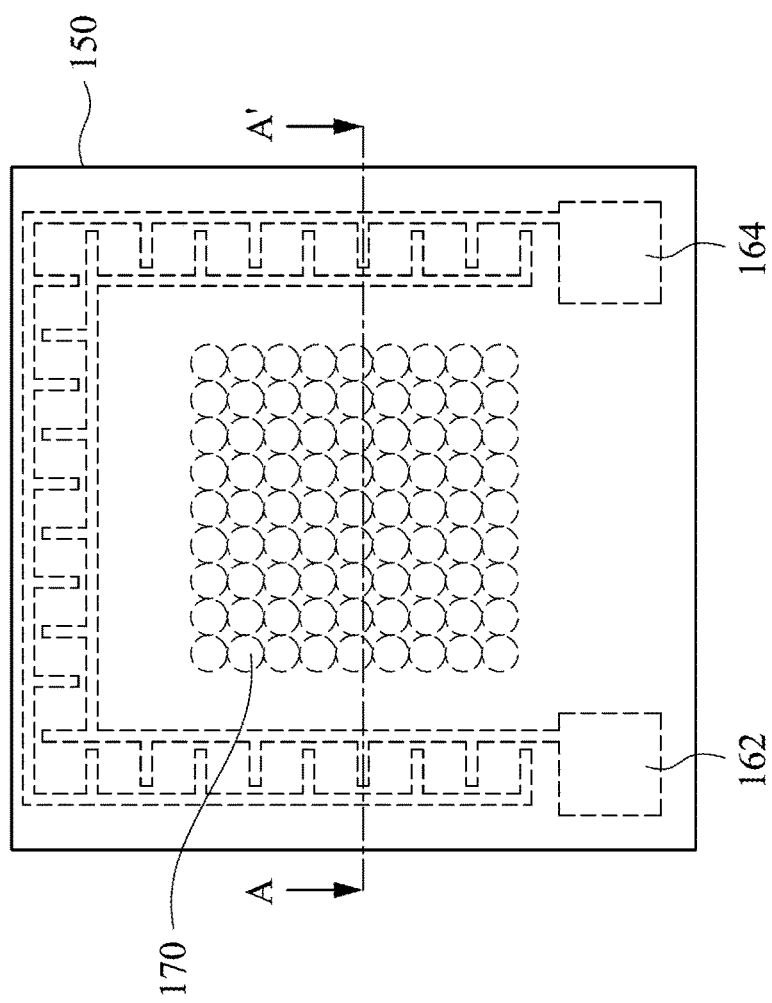
FIG. 9 is a top view of a cover according to FIG. 6.
Figure 10:
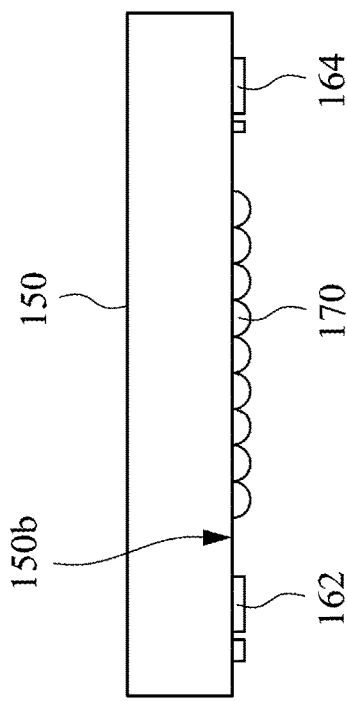
FIG. 10 is a cross-sectional view taken along line A-A' in FIG. 9.

FIG. 6 is a perspective view illustrating a package structure of a light-emitting element 10b, in accordance with various embodiments of the present disclosure. FIG. 7 is a top view illustrating the package structure of the light-emitting element 10b according to FIG. 6. FIG. 8 is a side view illustrating the package structure of the light-emitting element 10b according to FIG. 6. FIG. 9 is a top view of a cover 150 according to FIG. 6. FIG. 10 is a cross-sectional view taken along line A-A' in FIG. 9. To make it easy to compare differences between various embodiments and simplify the descriptions, the same symbols are used to label the same members in the following various embodiments and mainly the differences between the various embodiments are described while duplicate parts are not described again.

The difference between the package structure of the light-emitting element 10b and the package structure of the light-emitting element 10a of the previous embodiment is that, in this embodiment, a first light-transmitting sensing electrode 162 and a second light-transmitting sensing electrode 164 are disposed on a lower surface 150b of the cover 150, and the first light-transmitting sensing electrode 162 and the second light-transmitting sensing electrode 164 surround a portion of a periphery of an accommodating space 115. For example, when a top view pattern of the accommodating space 115 is a rectangle, the first light-transmitting sensing electrode 162 and the second light-transmitting sensing electrode 164 surround at least three sides of the accommodating space 115. In this embodiment, the first light-transmitting sensing electrode 162 and the second light-transmitting sensing electrode 164 surround at least three sides of the accommodating space 115 and present a comb structure that intersects each other in the top view. This design can effectively and accurately determine whether the cover 150 has any damage abnormality. In other embodiments, the first light-transmitting sensing electrode 162 and the second light-transmitting sensing electrode 164 may each have a comb structure of different length, thickness, or meandering design. In some embodiments, the package structure of the light-emitting element 10b further includes a lens array 170 disposed on the lower surface 150b of the cover 150, and the first light-transmitting sensing electrode 162 and the second light-transmitting sensing electrode 164 surround a portion of a periphery of the lens array 170. In various examples, a top view pattern of the lens array 170 may be circular, elliptical, or rectangular, but not limited thereto. For example, when the top view pattern of the lens array 170 is a rectangle, the first light-transmitting sensing electrode 162 and the second light-transmitting sensing electrode 164 surround at least three sides of the lens array 170.

Figure 11:
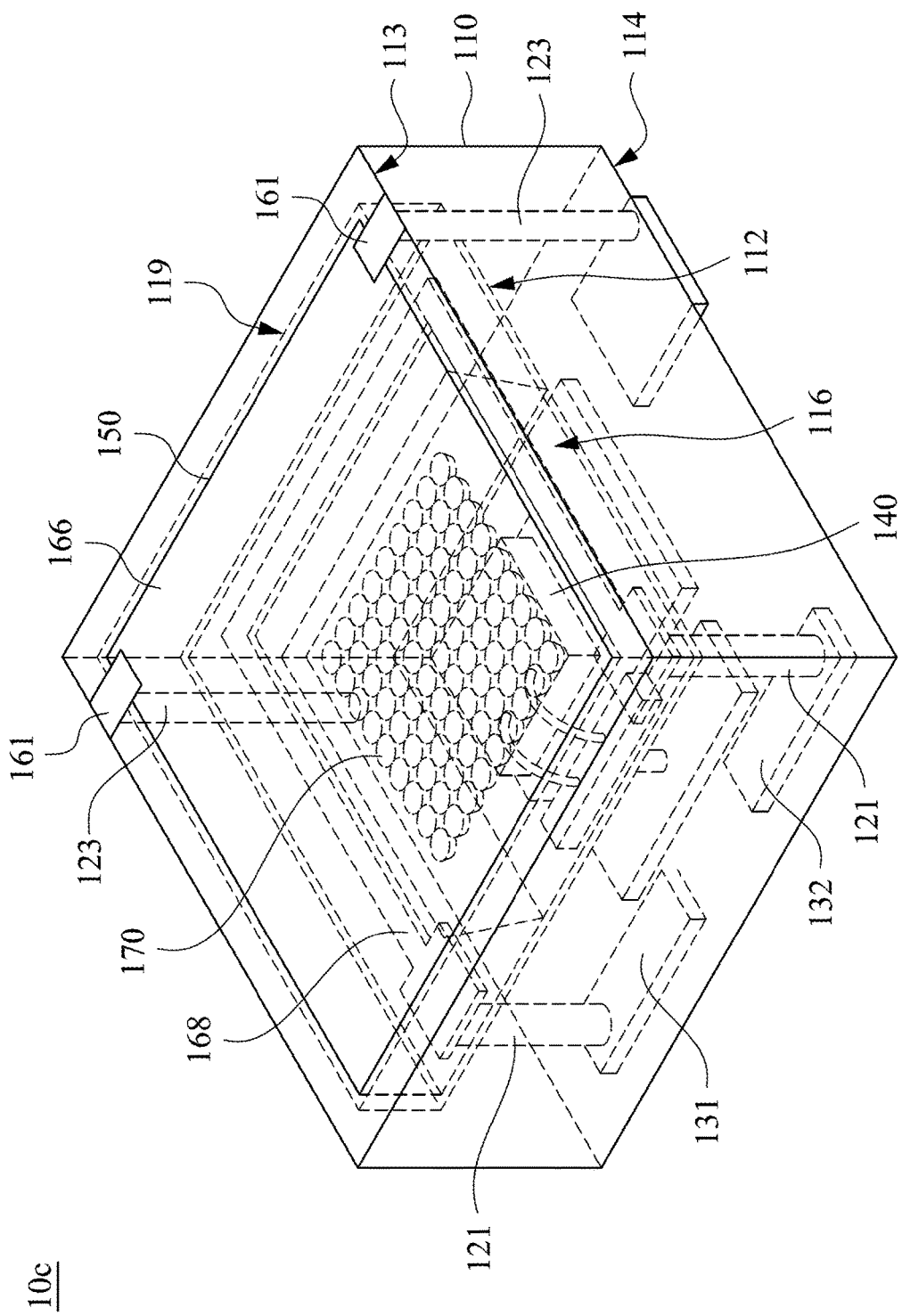
FIG. 11 is a perspective view illustrating a package structure of a light-emitting element, in accordance with another embodiment of the present disclosure.

FIG. 11 is a perspective view illustrating a package structure of a light-emitting element 10c, in accordance with another embodiment of the present disclosure. FIG. 12 is a top view illustrating the package structure of the light-emitting element 10c according to FIG. 11. FIG. 13 is a side view illustrating the package structure of the light-emitting element 10c according to FIG. 11. Referring to FIG. 11 through FIG. 13, the package structure of the light-emitting element 10c includes a shell 110, at least one first conductive path 121, at least one third conductive path 123, a light-emitting device 140, a cover 150, a first light-transmitting sensing electrode 166, and a second light-transmitting sensing electrode 168. Specifically, the shell 110 has a first top surface 112, a second top surface 113, and a bottom surface 114. The second top surface 113 is higher than the first top surface 112. The first top surface 112 is recessed toward the bottom surface 114 to form a first accommodating space 116, and the second top surface 113 is recessed toward the first top surface 112 to form a second accommodating space 119. The material and other features of the shell 110 are as described in relation to the shell 110 shown in FIG. 1, and so will not be described here.

The first conductive path 121 extends from the first top surface 112 to the bottom surface 114. In this embodiment, the package structure of the light-emitting element 10c includes two first conductive paths 121. The material and other features of the first conductive path 121 may be the same or similar to the first conductive path 121 and the second conductive path 122 shown in FIG. 1, and so will not be described here.

The third conductive path 123 extends from the second top surface 113 to the bottom surface 114. In this embodiment, the package structure of the light-emitting element 10c includes two third conductive paths 123. The material and other features of the third conductive path 123 may be the same or similar to the first conductive path 121 and the second conductive path 122 shown in FIG. 1, and so will not be described here.

The light-emitting device 140 is disposed in the first accommodating space 116. The material and other features of the light-emitting device 140 may be the same or similar to the light-emitting device 140 shown in FIG. 1, and so will not be described here.

The cover 150 is disposed in the second accommodating space 119. The material and other features of the cover 150 may be the same or similar to the cover 150 shown in FIG. 1, and so will not be described here. In some embodiments, the package structure of the light-emitting element 10c further includes a lens array 170 disposed on a lower surface 150b of the cover 150.

The first light-transmitting sensing electrode 166 and the second light-transmitting sensing electrode 168 are respectively disposed on opposite surfaces of the cover 150, and a capacitance is formed between the first light-transmitting sensing electrode 166 and the second light-transmitting sensing electrode 168. The first light-transmitting sensing electrode 166 and the second light-transmitting sensing electrode 168 are electrically connected to the third conductive path 123 and the first conductive path 121. The package structure of the light-emitting element 10c is electrically connected to a driving module (not shown), and when the capacitance value between the first light-transmitting sensing electrode 166 and the second light-transmitting sensing electrode 168 changes, this can be used to detect whether the cover 150 is damaged or peeled off in any direction, thereby preventing the light source from continuing to emit light in a state where the cover 150 is broken or peeled off. Therefore, such a design can effectively detect an abnormality of the cover 150, avoid erroneous determinations, and ensure the safety of the light-emitting device 140 to avoid harm to human eyes. The material and other features of the first light-transmitting sensing electrode 166 and the second light-transmitting sensing electrode 168 may be the same or similar to the first light-transmitting sensing electrode 162 and the second light-transmitting sensing electrode 164 shown in FIG. 1, and so will not be described here.

In some embodiments, the package structure of the light-emitting element 10c further includes at least one conductive sheet 161 disposed on the second top surface 113. The conductive sheet 161 contacts the first light-transmitting sensing electrode 166 and the third conductive path 123. In this embodiment, the package structure of the light-emitting element 10c includes two conductive sheets 161. The conductive sheet 161 may include conductive materials, such as Ni, Ag, Ni/Au alloy or a combination thereof.

Figure 14:
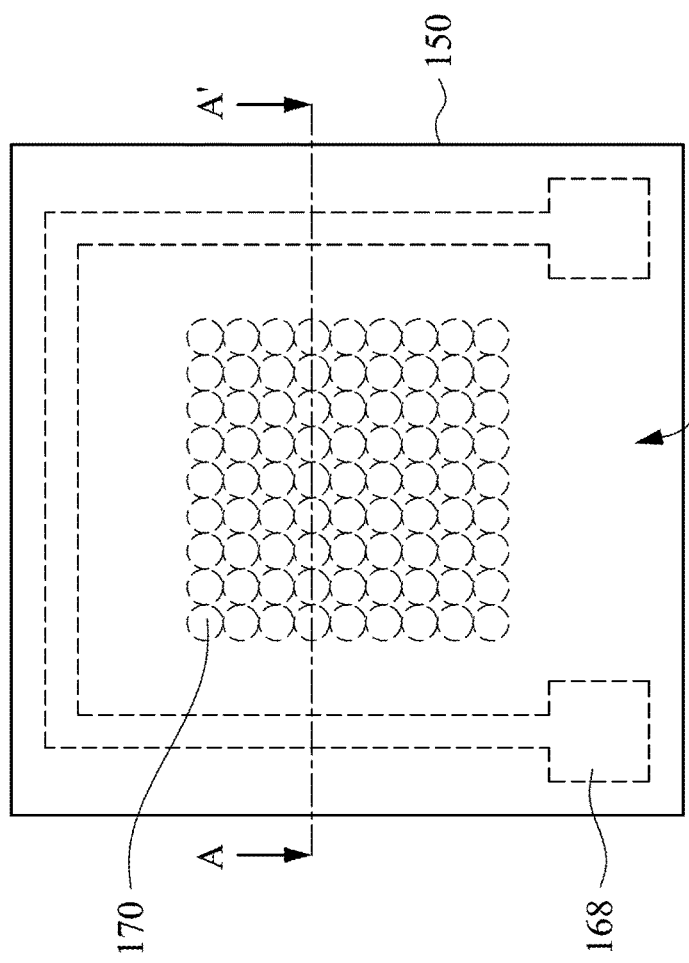
FIG. 14 is a top view of a cover according to FIG. 11.
Figure 15:
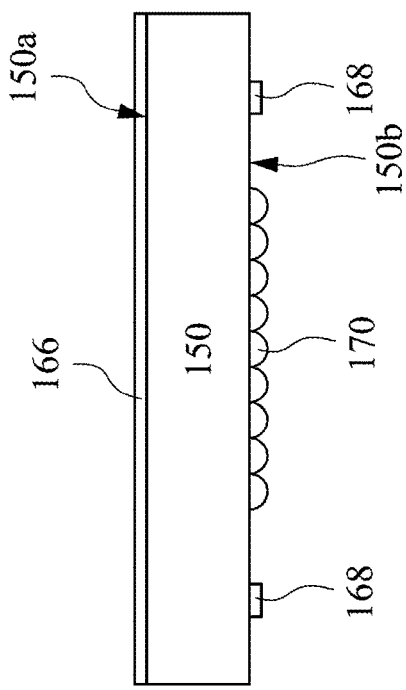
FIG. 15 is a cross-sectional view taken along line A-A' in FIG. 14.

FIG. 14 is a top view of the cover 150 according to FIG. 11. FIG. 15 is a cross-sectional view taken along line A-A' in FIG. 14. Referring to FIG. 14 and FIG. 15, in this embodiment, the first light-transmitting sensing electrode 166 completely covers an upper surface 150a of the cover 150. The second light-transmitting sensing electrode 168 is a patterned light-transmitting sensing electrode and is disposed on the lower surface 150b of the cover 150, and the patterned light-transmitting sensing electrode 168 surrounds at least three sides of the first accommodating space 116 (see FIG. 11). More specifically, the patterned light-transmitting sensing electrode 168 is disposed at a position near a periphery of the lower surface 150b of the cover 150, and is disposed along a contour of a perimeter of the cover 150. This design can effectively and accurately determine whether the cover 150 has any damage abnormality. In other embodiments, the patterned light-transmitting sensing electrode 168 may be U-shaped. In other words, the patterned light-transmitting sensing electrode 168 may be U-shaped with or without a right angle(s), and the present disclosure is not limited thereto. More specifically, the patterned light-transmitting sensing electrode 168 has an opening 166". Referring back to FIG. 11, in some embodiments, the first conductive path 121 is located at one side of the opening 166" and the third conductive path 123 is located at an opposite side of the opening 166".

Figure 16:
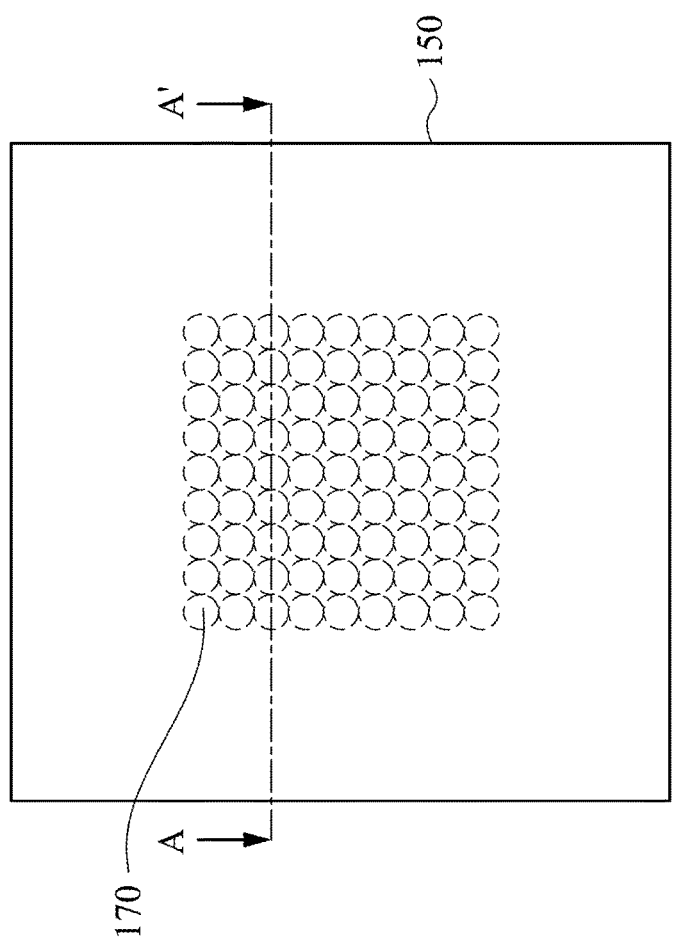
FIG. 16 is a top view of a cover according to another embodiment.
Figure 17:
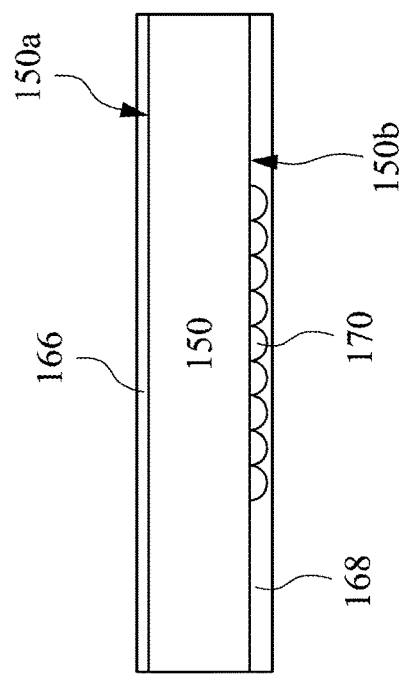
FIG. 17 is a cross-sectional view taken along line A-A' in FIG. 16.

FIG. 16 is a top view of a cover 150 according to another embodiment. FIG. 17 is a cross-sectional view taken along line A-A' in FIG. 16. Referring to FIG. 16 and FIG. 17, in this embodiment, a first light-transmitting sensing electrode 166 completely covers an upper surface 150a of the cover 150, and a second light-transmitting sensing electrode 168 completely covers a lower surface 150b of the cover 150. More specifically, the second light-transmitting sensing electrode 168 completely covers the lower surface 150b of the cover 150 and the lens array 170. This design can effectively and accurately determine whether the cover 150 has any damage abnormality.

Figure 18:
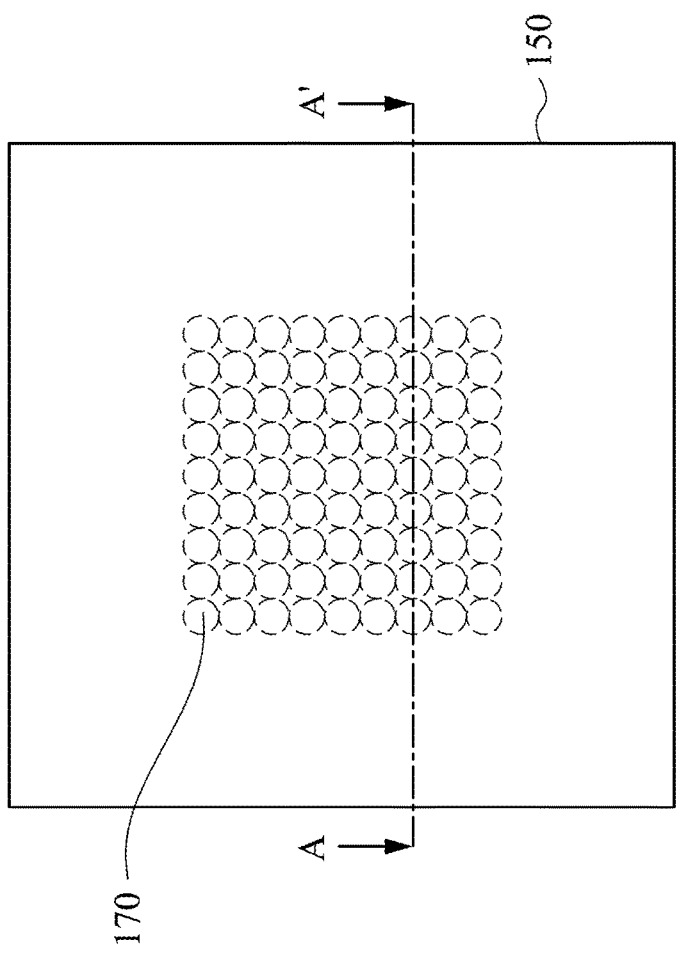
FIG. 18 is a top view of a cover according to still another embodiment.
Figure 19:
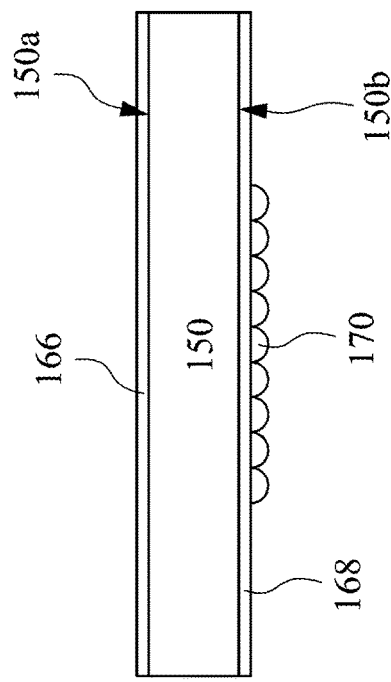
FIG. 19 is a cross-sectional view taken along line A-A' in FIG. 18.

FIG. 18 is a top view of a cover 105 according to still another embodiment. FIG. 19 is a cross-sectional view taken along line A-A' in FIG. 18. Referring to FIG. 18 and FIG. 19, in this embodiment, a first light-transmitting sensing electrode 166 completely covers an upper surface 150a of the cover 150, and a second light-transmitting sensing electrode 168 completely covers a lower surface 150b of the cover 150. Moreover, a lens array 170 is disposed below the second light-transmitting sensing electrode 168. That is, the second light-transmitting sensing electrode 168 is disposed between the lower surface 150b of the cover 150 and the lens array 170. This design can effectively and accurately determine whether the cover 150 has any damage abnormality.

Figure 20:
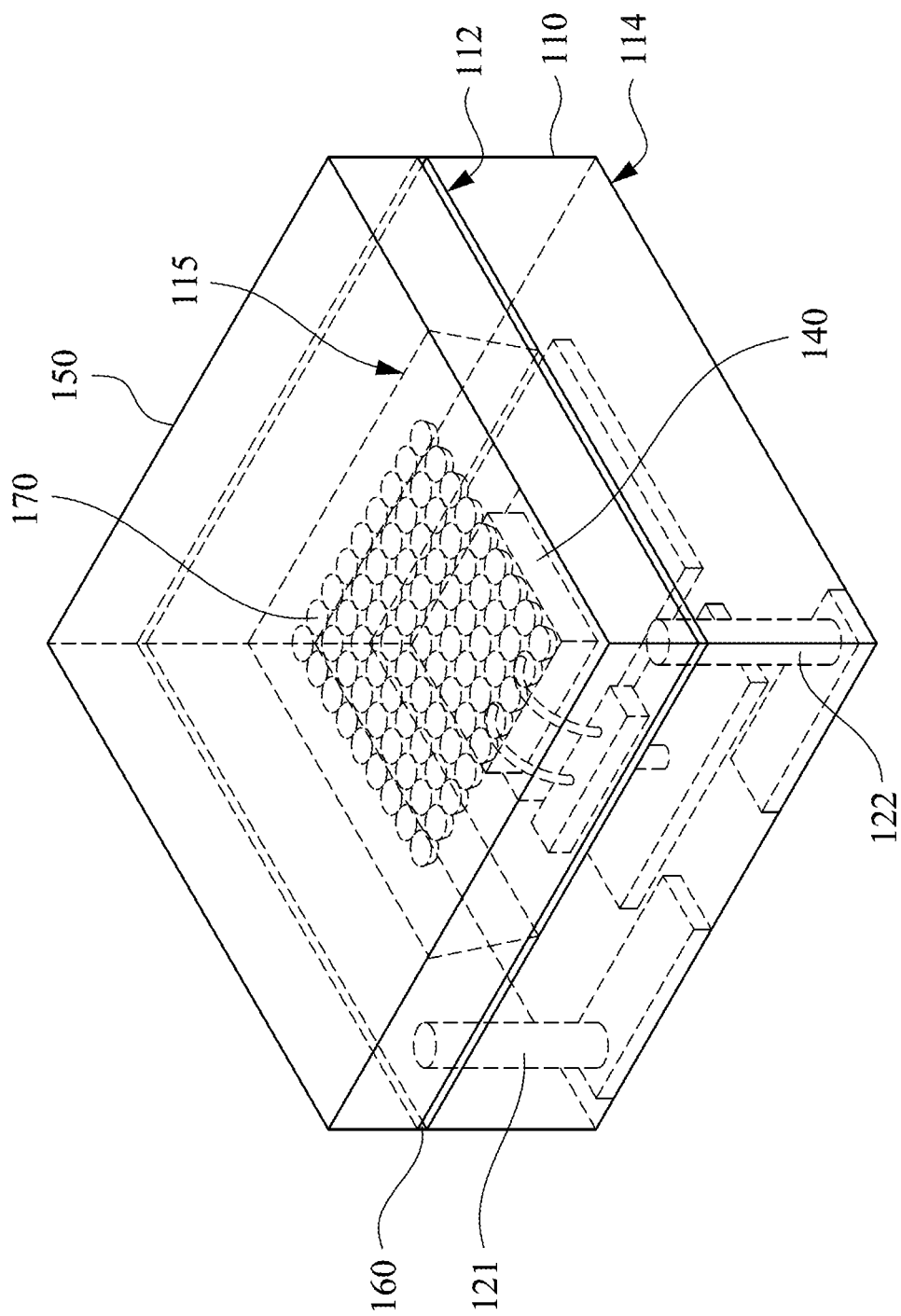
FIG. 20 is a perspective view illustrating a package structure of a light-emitting element, in accordance with various embodiments of the present disclosure.
Figure 22:
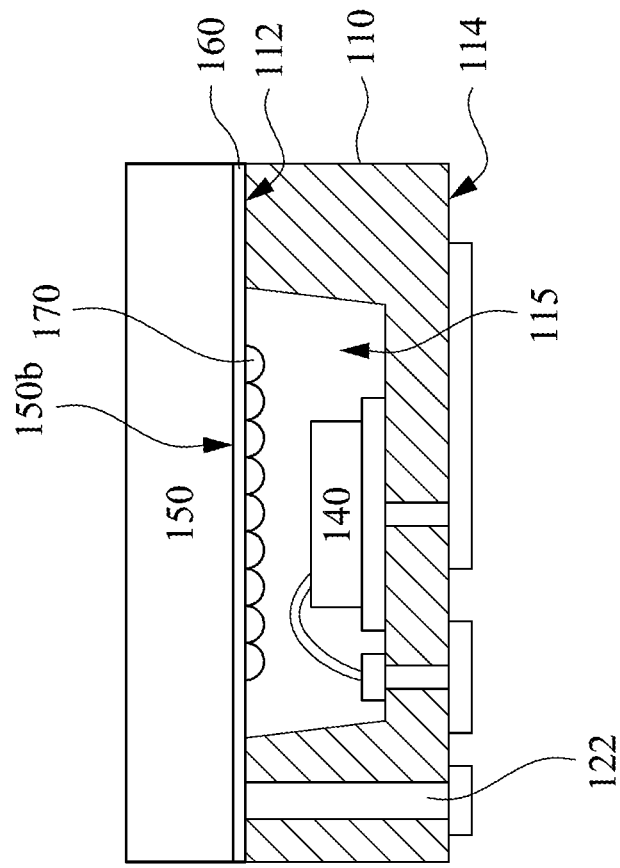
FIG. 22 is a side view illustrating the package structure of the light-emitting element according to FIG. 20.
Figure 21:
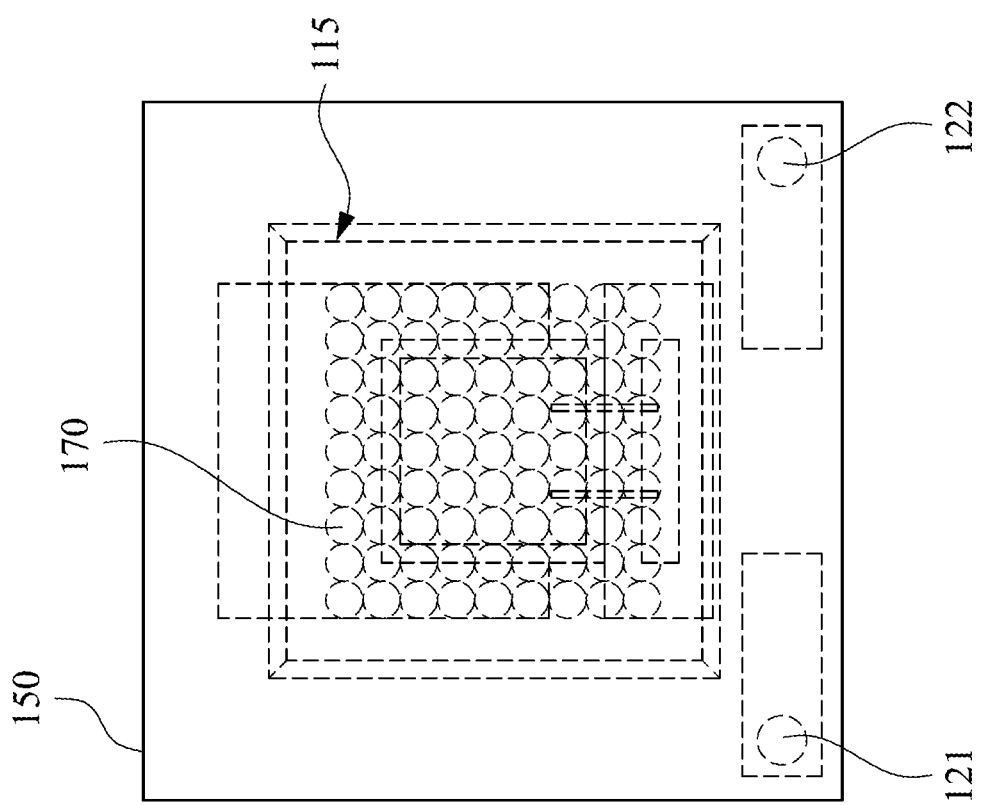
FIG. 21 is a top view illustrating the package structure of the light-emitting element according to FIG. 20.

FIG. 20 is a perspective view illustrating a package structure of a light-emitting element 10d, in accordance with various embodiments of the present disclosure. FIG. 21 is a top view illustrating the package structure of the light-emitting element 10d according to FIG. 20. FIG. 22 is a side view illustrating the package structure of the light-emitting element 10d according to FIG. 20. Referring to FIG. 20 through FIG. 22, the package structure of the light-emitting element 10d includes a shell 110, a first conductive path 121, a second conductive path 122, a light-emitting device 140, a cover 150, and a light-transmitting conductive unit 160. The shell 110 has a top surface 112 and a bottom surface 114 and the top surface 112 is recessed toward the bottom surface 114 to form an accommodating space 115. The material and other features of the shell 110 may be the same or similar to the shell 110 shown in FIG. 1, and so will not be described here.

The first conductive path 121 and the second conductive path 122 respectively extend from the top surface 112 to the bottom surface 114. The material and other features of the first conductive path 121 may be the same or similar to the first conductive path 121 and the second conductive path 122 shown in FIG. 1, and so will not be described.

The light-emitting device 140 is disposed in the accommodating space 115. The material and other features of the light-emitting device 140 may be the same or similar to the light-emitting device 140 shown in FIG. 1, and so will not be described here.

The cover 150 is disposed over the light-emitting device 140. The material and other features of the cover 150 may be the same or similar to the cover 150 shown in FIG. 1, and so will not be described here.

The light-transmitting conductive unit 160 is disposed on the cover 150. The first conductive path 121 and the second conductive path 122 are electrically connected to the light-transmitting conductive unit 160 to form a loop. The material of the light-transmitting conductive unit 160 may be the same or similar to the first light-transmitting sensing electrode 162 and the second light-transmitting sensing electrode 164 shown in FIG. 1, and so will not be described here. When the loop is electrically connected to a driving module (not shown) and the cover 150 is broken or peeled off in any direction, this design will cause the driving module to turn off the switch of the light-emitting device 140, thereby preventing the light source from continuing to emit light in a state where the cover 150 is broken or peeled off. In addition, the materials of the light-transmitting conductive unit 160 may further include thermal materials and light sensitive materials. For example, the thermal materials include materials which are sufficiently mixed with oxides of manganese, copper, silicon, cobalt, iron, nickel, and zinc, and the light sensitive materials include selenium-based oxides such as cadmium (II) selenide. In the embodiment where the light-transmitting conductive unit 160 includes thermal materials, when the loop is electrically connected to a driving module (not shown), the current in the loop generates heat. If the cover 150 is broken or peeled off in any direction, this causes the heat generated by the circuit to change, thereby causing the driving module to close the switch of the light-emitting device 140, and the light source can be prevented from continuing to emit light in a state where the cover 150 is broken or peeled off. In the embodiment where the light-transmitting conductive unit 160 includes light sensitive materials, when the loop is electrically connected to a driving module (not shown) and the cover 150 is broken or peeled off in any direction, the light-transmitting conductive unit 160 produces a change in light intensity, thereby causing the driving module to close the switch of the light-emitting device 140. As a result, the light source can be prevented from continuing to emit light in a state where the cover 150 is broken or peeled off. Therefore, such a design can effectively detect an abnormality of the cover 150, avoid erroneous determinations, and ensure the safety of the light-emitting device 140 to avoid harm to human eyes.

Figure 23:
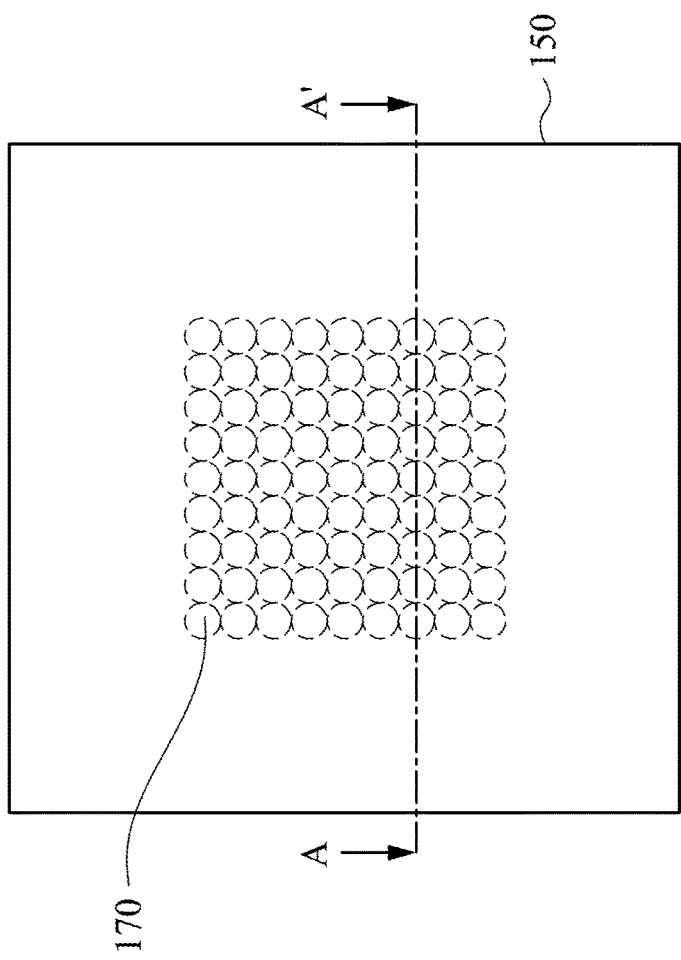
FIG. 23 is a top view of the cover according to FIG. 20.
Figure 24:
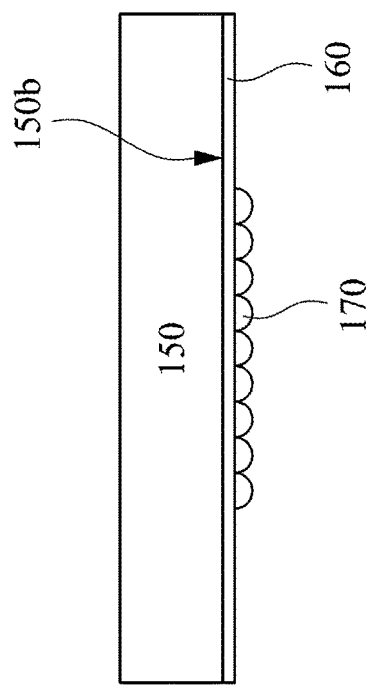
FIG. 24 is a cross-sectional view taken along line A-A' in FIG. 23.

FIG. 23 is a top view of the cover 150 according to FIG. 20. FIG. 24 is a cross-sectional view taken along line A-A' in FIG. 23. Referring to FIG. 23 and FIG. 24, in this embodiment, the package structure of the light-emitting element 10d further includes a lens array 170 disposed on the lower surface 150b of the cover 150. The light-transmitting conductive unit 160 completely covers the lower surface 150b of the cover 150, and the light-transmitting conductive unit 160 is disposed between the cover 150 and the lens array 170. This design can effectively and accurately determine whether the cover 150 has any damage abnormality.

Figure 25:
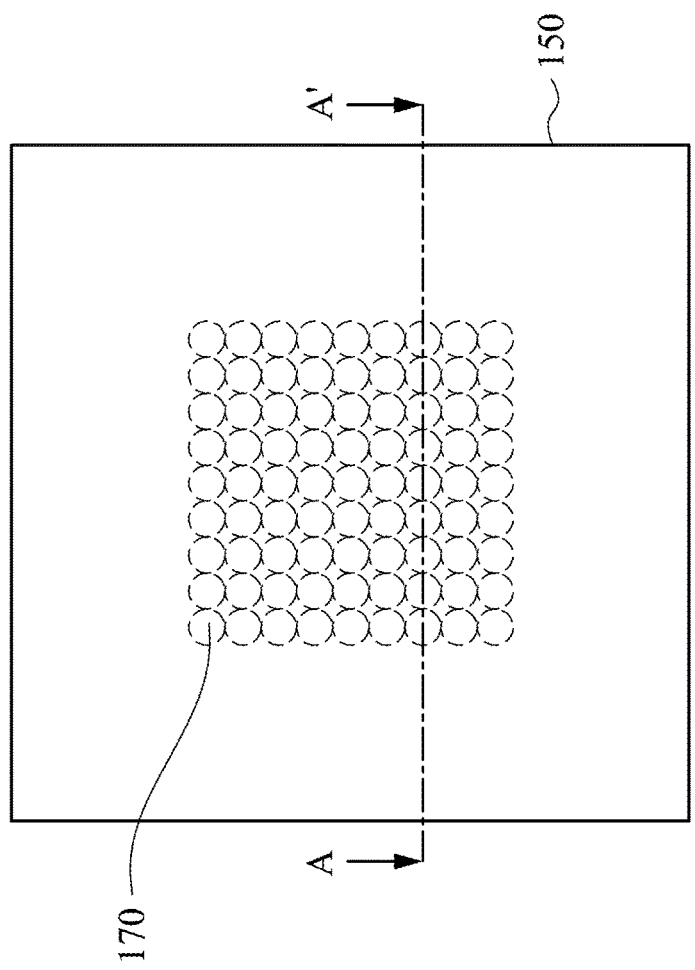
FIG. 25 is a top view of a cover according to another embodiment.
Figure 26:
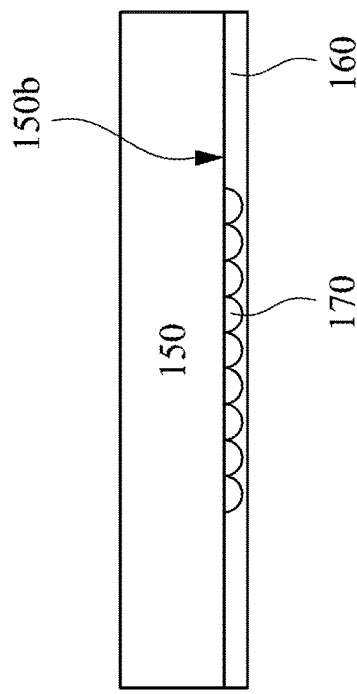
FIG. 26 is a cross-sectional view taken along line A-A' in FIG. 25.

FIG. 25 is a top view of a cover 150 according to another embodiment, in which the cover 150 may be applied to the package structure of the light-emitting element 10d of the previous embodiment. FIG. 26 is a cross-sectional view taken along line A-A' in FIG. 25. Referring to FIG. 25 and FIG. 26, in this embodiment, the package structure of the light-emitting element 10d further includes a lens array 170 disposed on a lower surface 150b of the cover 150 A light-transmitting conductive unit 160 completely covers the lower surface 150b of the cover 150 and the lens array 170. This design can effectively and accurately determine whether the cover 150 has any damage abnormality.

Figure 27:
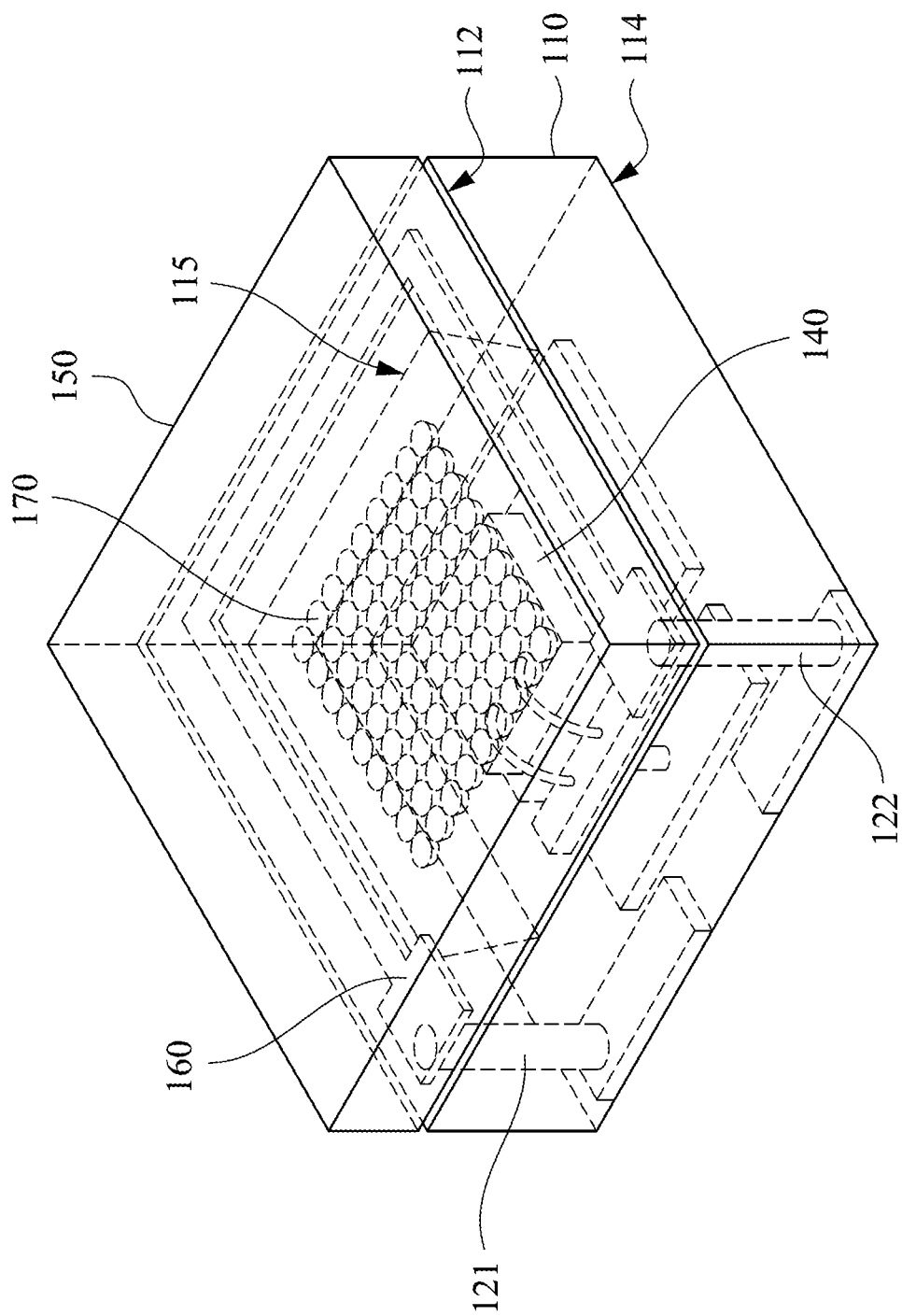
FIG. 27 is a perspective view illustrating a package structure of a light-emitting element, in accordance with yet another embodiment of the present disclosure.
Figure 28:
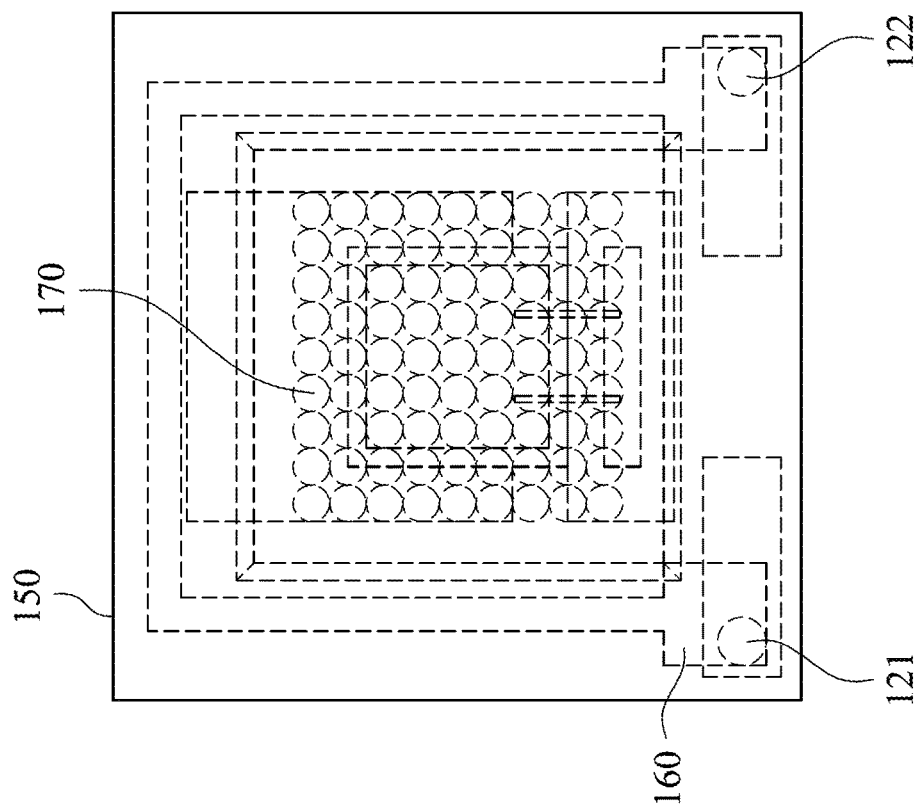
FIG. 28 is a top view illustrating the package structure of the light-emitting element according to FIG. 27.
Figure 29:
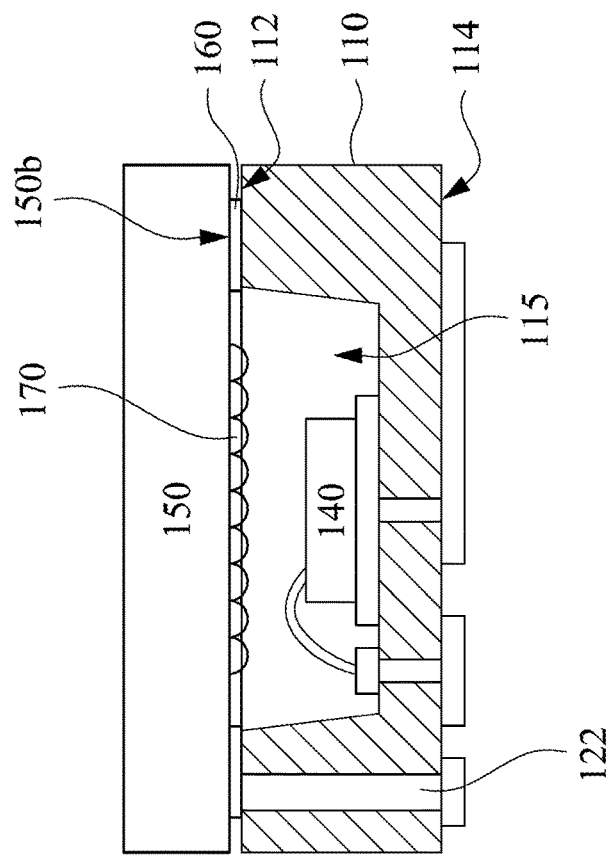
FIG. 29 is a side view illustrating the package structure of the light-emitting element according to FIG. 27.
Figure 30:
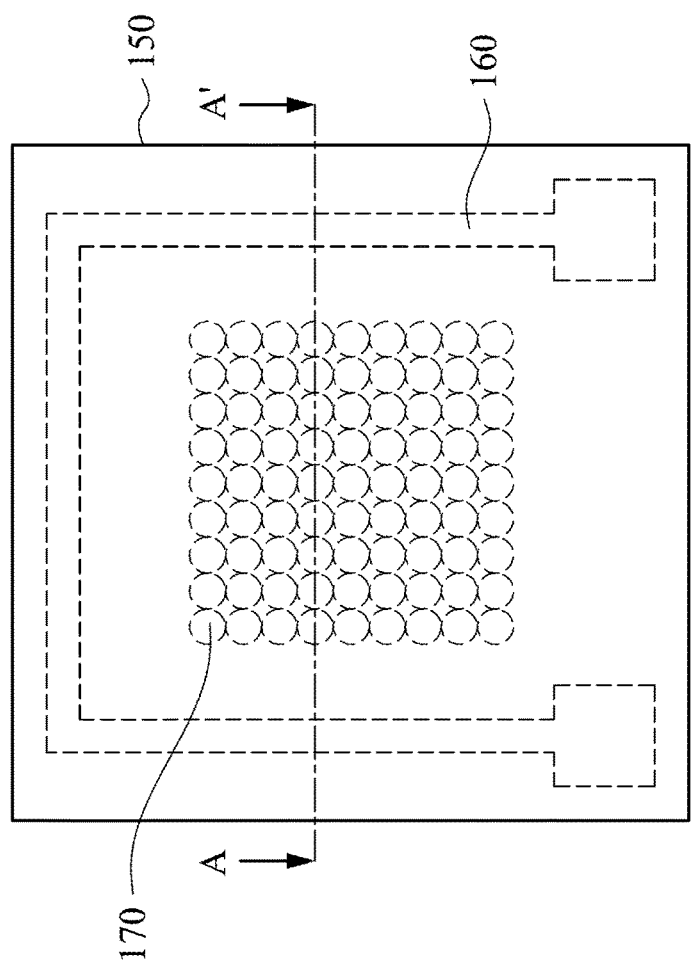
FIG. 30 is a top view of a cover according to FIG. 27.
Figure 31:
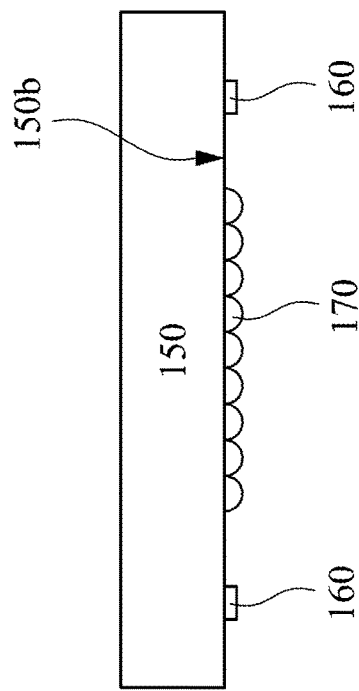
FIG. 31 is a cross-sectional view taken along line A-A' in FIG. 30.

FIG. 27 is a perspective view illustrating a package structure of a light-emitting element 10e, in accordance with yet another embodiment of the present disclosure. FIG. 28 is a top view illustrating the package structure of the light-emitting element 10e according to FIG. 27. FIG. 29 is a side view illustrating the package structure of the light-emitting element 10e according to FIG. 27. FIG. 30 is a top view of a cover 150 according to FIG. 27. FIG. 31 is a cross-sectional view taken along line A-A' in FIG. 30. To make it easy to compare differences between various embodiments and simplify the descriptions, the same symbols are used to label the same members in the following various embodiments and mainly the differences between the various embodiments are described while duplicate parts are not described again.

The difference between the package structure of the light-emitting element 10e and the package structure of the light-emitting element 10d of the previous embodiments is that, in this embodiment, the light-transmitting conductive unit 160 is a patterned conductive unit and is disposed on a lower surface 150b of the cover 150, and the patterned conductive unit 160 surrounds at least three sides of the accommodating space 115. In some embodiments, the package structure of the light-emitting element 10e further includes a lens array 170 disposed on the lower surface 150b of the cover 150, and the patterned conductive unit 160 surrounds at least three sides of the lens array 170. As shown in FIG. 30, in this embodiment, the patterned conductive unit 160 has an opening, that is, the patterned conductive unit is a non-closed loop. More specifically, the patterned conductive unit 160 is disposed at a position near a periphery of the cover 150, and is disposed along a contour of a perimeter of the cover 150. The patterned conductive unit 160 may be U-shaped. In other words, the patterned conductive unit 160 may be U-shaped with or without a right angle(s), and the present disclosure is not limited thereto. In addition, the patterned conductive unit 160 may also be a "□" shaped with an opening. When the package structure of the light-emitting element 10e is electrically connected to a driving module (not shown), a loop may be formed. When the cover 150 is broken or peeled off in any direction, the circuit generates a change in light, heat, voltage, or resistance, thereby turning the switch of the light-emitting device 140 off. In this way, the light source can be prevented from continuing to emit light in a state where the cover 150 is broken or peeled off. Therefore, such a design can effectively detect an abnormality of the cover 150, avoid erroneous determinations, and ensure the safety of the light-emitting device 140 to avoid harm to human eyes.

Figure 32:
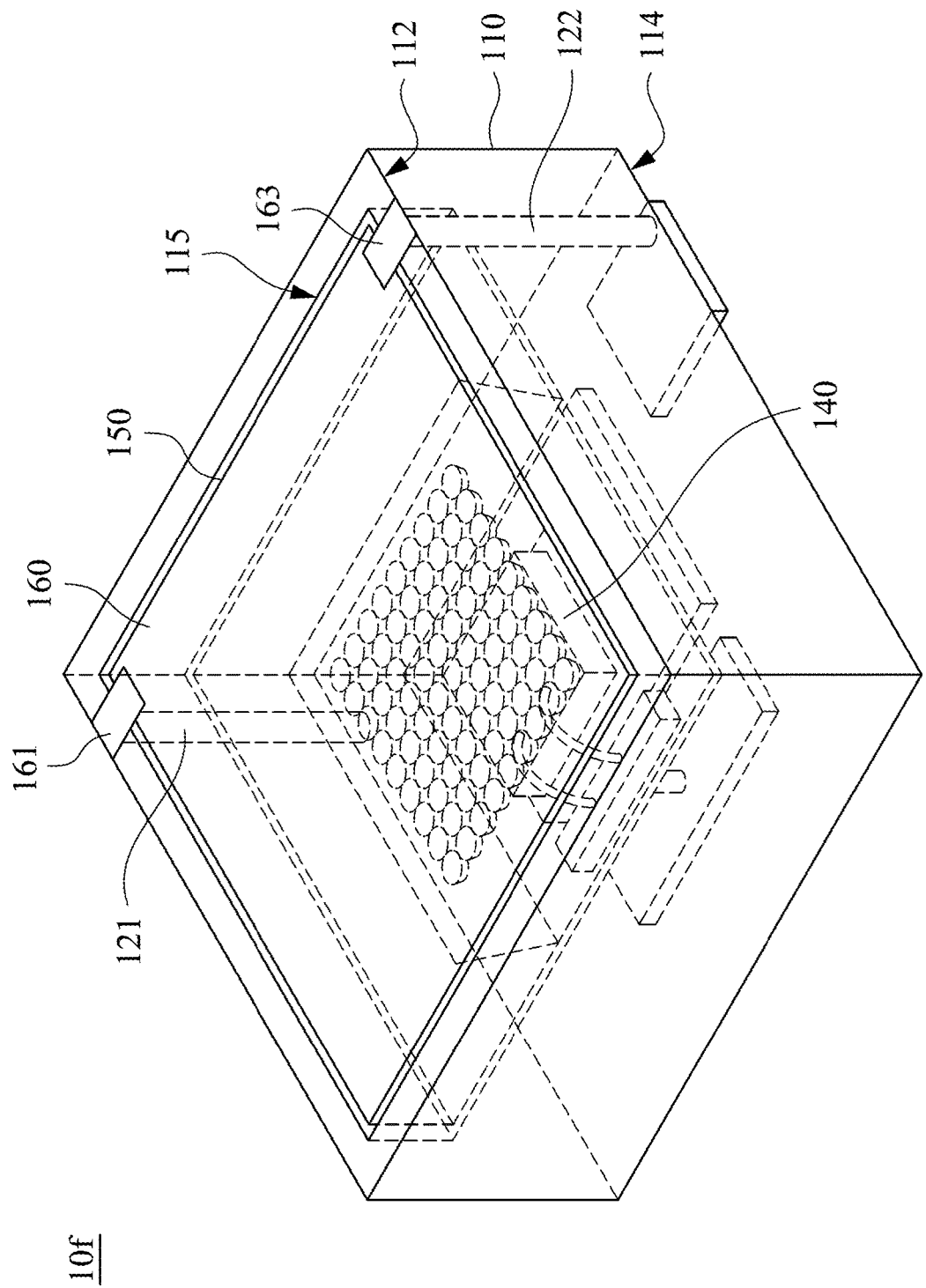
FIG. 32 is a perspective view illustrating a package structure of a light-emitting element, in accordance with yet another embodiment of the present disclosure.
Figures 33, 34:
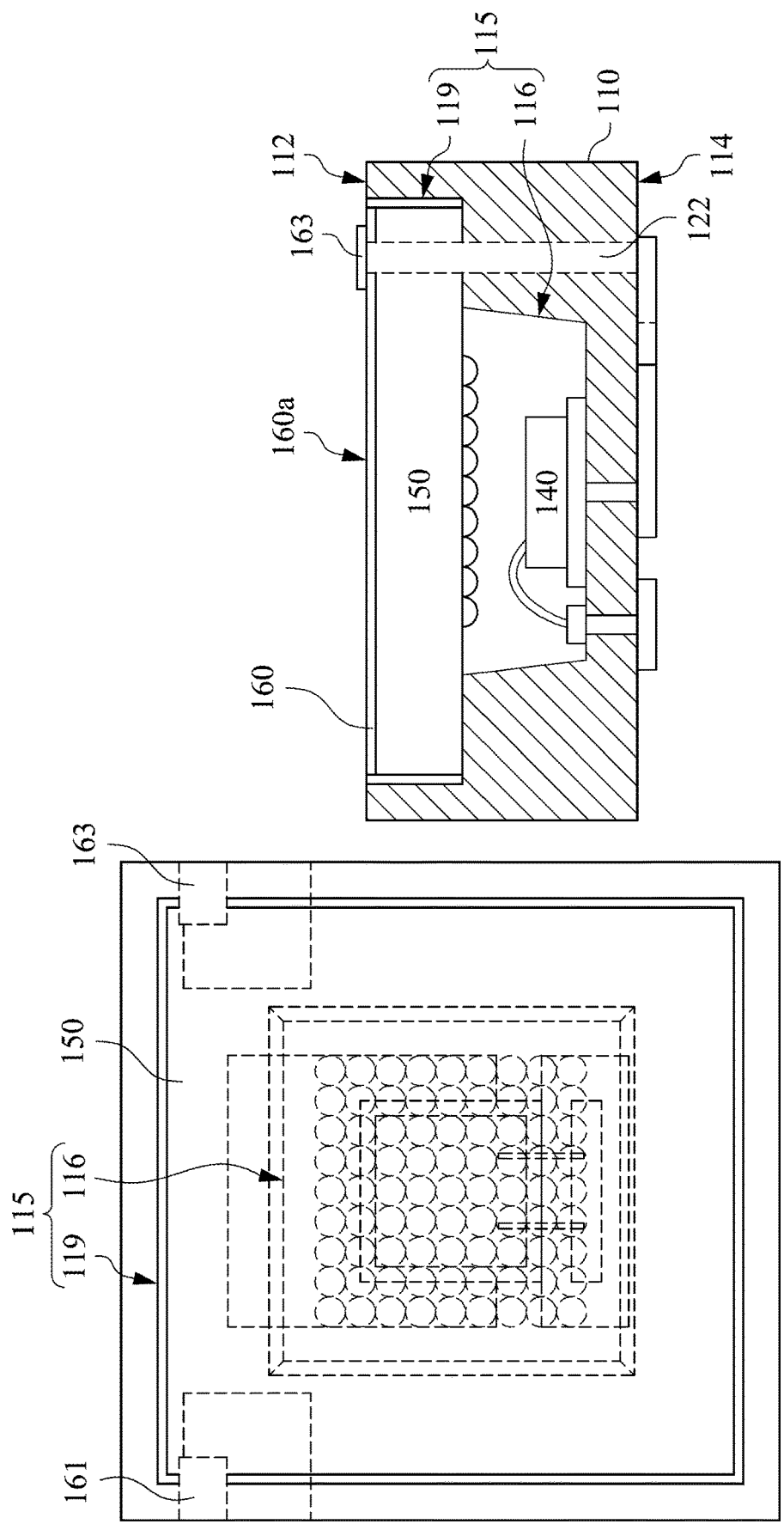
FIG. 33 is a top view illustrating the package structure of the light-emitting element according to FIG. 32.
FIG. 34 is a side view illustrating the package structure of the light-emitting element according to FIG. 32.
Figure 35:
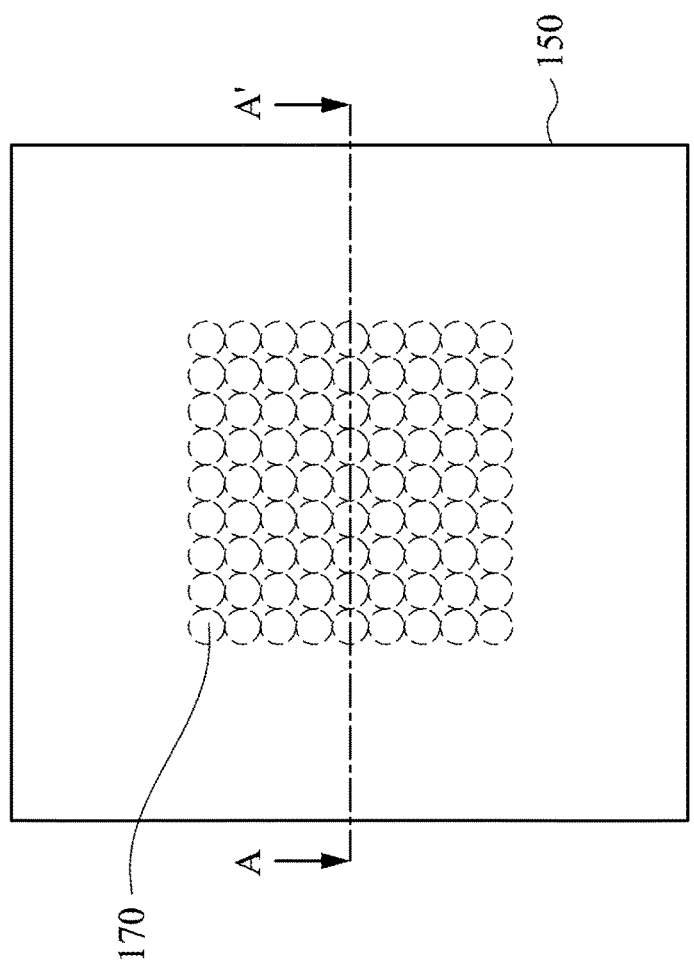
FIG. 35 is a top view of a cover according to FIG. 32.
Figure 36:
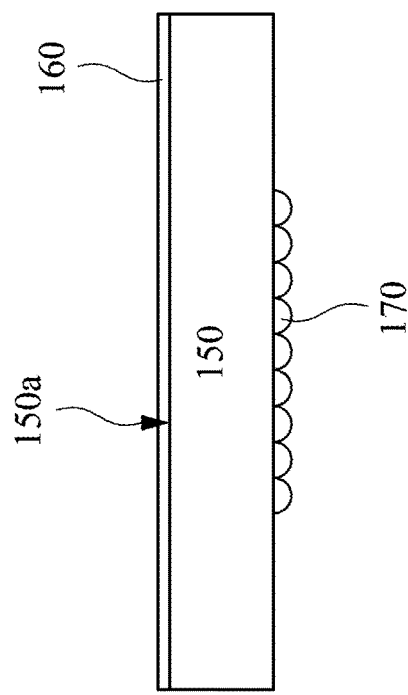
FIG. 36 is a cross-sectional view taken along line A-A' in FIG. 35.

FIG. 32 is a perspective view illustrating a package structure of a light-emitting element 10f, in accordance with yet another embodiment of the present disclosure. FIG. 33 is a top view illustrating the package structure of the light-emitting element according to FIG. 32. FIG. 34 is a side view illustrating the package structure of the light-emitting element according to FIG. 32. FIG. 35 is a top view of a cover 150 according to FIG. 32. FIG. 36 is a cross-sectional view taken along line A-A' in FIG. 35. To make it easy to compare differences between various embodiments and simplify the descriptions, the same symbols are used to label the same members in the following various embodiments and mainly the differences between the various embodiments are described while duplicate parts are not described again.

The difference between the package structure of the light-emitting element 10f and the package structure of the light-emitting element 10d of the previous embodiment is that, in this embodiment, an accommodating space 115 includes a first accommodating space 116 and a second accommodating space 119. The second accommodating space 119 is located on the first accommodating space 116, and a width of the second accommodating space 119 is greater than a width of the first accommodating space 116. Moreover, in this embodiment, the light-emitting device 140 is disposed in the first accommodating space 116, and the cover 150 is disposed in the second accommodating space 119. The light-transmitting conductive unit 160 completely covers an upper surface 150a of the cover 150, and a top surface 160a of the light-transmitting conductive unit 160 is substantially level with a top surface 112 of a shell 110. In some embodiments, the package structure of the light-emitting element 10f further includes a first conductive sheet 161 and a second conductive sheet 163 disposed on the top surface 112 of the shell 110. The first conductive sheet 161 contacts the light-transmitting conductive unit 160 and the first conductive path 121, and the second conductive sheet 163 contact the light-transmitting conductive unit 160 and the second conductive path 122. After the package structure of the light-emitting element 10f is electrically connected to a driving module (not shown), a loop may be formed. When the cover 150 is broken or peeled off in any direction, the circuit generates a change in light, heat, voltage, or resistance, thereby turning the switch of the light-emitting device 140 off. In this way, the light source can be prevented from continuing to emit light in a state where the cover 150 is broken or peeled off. Therefore, such a design can effectively detect an abnormality of the cover 150, avoid erroneous determinations, and ensure the safety of the light-emitting device 140 to avoid harm to human eyes.

In summary, after the package structure of the light-emitting element provided by the present disclosure is electrically connected to a driving module, it can detect whether foreign objects fall on the cover and detect whether the cover is broken or peeled off. The package structure of the light-emitting element includes the first light-transmitting sensing electrode and the second light-transmitting sensing electrode disposed on the cover and a capacitance is formed between the two. When the capacitance value changes, it can be used to detect whether foreign objects fall on the cover and whether the cover is broken or peeled off. In addition, the cover of the package structure of the light-emitting element has a non-closed patterned conductive unit, and the patterned conductive unit connects the first conductive path and the second conductive path to form a loop. When the loop generates a change in voltage or resistance, it can be used to detect whether the cover is broken or peeled off, thereby controlling the switch of the light-emitting device. That is to say, when it is detect that the cover is broken or peeled off, the switch of the light-emitting device is actively turned off to avoid harm to human eyes caused by the light source in the case where the cover is damaged or detached.

Although the present disclosure has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A package structure of a light-emitting element, comprising:
   a shell having a top surface and a bottom surface, wherein the top surface is recessed toward the bottom surface to form an accommodating space;
   a first conductive path and a second conductive path, each extending from the top surface to the bottom surface;
   a light-emitting device disposed in the accommodating space;
   a cover disposed over the shell; and
   a first light-transmitting sensing electrode and a second light-transmitting sensing electrode disposed on a same surface of the cover, wherein a capacitance is formed between the first light-transmitting sensing electrode and the second light-transmitting sensing electrode, and wherein the first light-transmitting sensing electrode and the second light-transmitting sensing electrode are electrically connected to the first conductive path and the second conductive path, respectively.

2. The package structure of the light-emitting element of claim 1, wherein the first light-transmitting sensing electrode and the second light-transmitting sensing electrode are disposed on a lower surface of the cover, and a vertical projection of the first light-transmitting sensing electrode and the second light-transmitting sensing electrode on the cover overlaps with a vertical projection of the light-emitting device on the cover.

3. The package structure of the light-emitting element of claim 1, wherein the first light-transmitting sensing electrode and the second light-transmitting sensing electrode are disposed on a lower surface of the cover, and the first light-transmitting sensing electrode and the second light-transmitting sensing electrode surround a portion of a periphery of the accommodating space.

4. The package structure of the light-emitting element of claim 1, further comprising a lens array disposed on a lower surface of the cover.

5. A package structure of a light-emitting element, comprising:
a shell having a first top surface, a second top surface and a bottom surface, wherein the second top surface is higher than the first top surface, the first top surface is recessed toward the bottom surface to form a first accommodating space, and the second top surface is recessed toward the first top surface to form a second accommodating space;
at least one first conductive path extending from the first top surface to the bottom surface;
at least one third conductive path extending from the second top surface to the bottom surface;
a light-emitting device disposed in the first accommodating space;
a cover disposed in the second accommodating space; and
a first light-transmitting sensing electrode and a second light-transmitting sensing electrode respectively disposed on opposite surfaces of the cover, wherein a capacitance is formed between the first light-transmitting sensing electrode and the second light-transmitting sensing electrode, and wherein the first light-transmitting sensing electrode and the second light-transmitting sensing electrode are electrically connected to the third conductive path and the first conductive path, respectively.

6. The package structure of the light-emitting element of claim 5, wherein the first light-transmitting sensing electrode completely covers an upper surface of the cover.

7. The package structure of the light-emitting element of claim 5, wherein the second light-transmitting sensing electrode is a patterned light-transmitting sensing electrode and is disposed on a lower surface of the cover, and the patterned light-transmitting sensing electrode surrounds a portion of a periphery of the first accommodating space.

8. The package structure of the light-emitting element of claim 5, wherein the second light-transmitting sensing electrode completely covers a lower surface of the cover.

9. The package structure of the light-emitting element of claim 8, further comprising a lens array disposed on the lower surface of the cover, wherein the second light-transmitting sensing electrode completely covers the lower surface of the cover and the lens array.

10. The package structure of the light-emitting element of claim 5, further comprising a lens array disposed on a lower surface of the cover, wherein the second light-transmitting sensing electrode completely covers the lower surface of the cover and the second light-transmitting sensing electrode is disposed between the cover and the lens array.

11. The package structure of the light-emitting element of claim 5, further comprising at least one conductive sheet disposed on the second top surface, the conductive sheet contacting the first light-transmitting sensing electrode and the third conductive path.

12. A package structure of a light-emitting element, comprising:
a shell having a top surface and a bottom surface, wherein the top surface is recessed toward the bottom surface to form an accommodating space;
a first conductive path and a second conductive path, each extending from the top surface to the bottom surface;
a light-emitting device disposed in the accommodating space;
a cover disposed over the light-emitting device; and
a light-transmitting conductive unit disposed on the cover, wherein the first conductive path and the second conductive path are electrically connected to the light-transmitting conductive unit.

13. The package structure of the light-emitting element of claim 12, further comprising a lens array disposed on a lower surface of the cover, wherein the light-transmitting conductive unit completely covers the lower surface of the cover and the light-transmitting conductive unit is disposed between the cover and the lens array.

14. The package structure of the light-emitting element of claim 12, further comprising a lens array disposed on a lower surface of the cover, wherein the light-transmitting conductive unit completely covers the lower surface of the cover and the lens array.

15. The package structure of the light-emitting element of claim 12, wherein the light-transmitting conductive unit is a patterned conductive unit and is disposed on a lower surface of the cover, and the patterned conductive unit surrounds a portion of a periphery of the accommodating space.

16. The package structure of the light-emitting element of claim 15, further comprising a lens array disposed on the lower surface of the cover, the patterned conductive unit surrounding a portion of a periphery of the lens array.

17. The package structure of the light-emitting element of claim 12, wherein the accommodating space comprises a first accommodating space and a second accommodating space, the second accommodating space is located on the first accommodating space, and a width of the second accommodating space is greater than a width of the first accommodating space.

18. The package structure of the light-emitting element of claim 17, wherein the light-emitting device is disposed in the first accommodating space and the cover is disposed in the second accommodating space.

19. The package structure of the light-emitting element of claim 18, wherein the light-transmitting conductive unit completely covers an upper surface of the cover and a top surface of the light-transmitting conductive unit is substantially level with the top surface of the shell.

20. The package structure of the light-emitting element of claim 19, further comprising a first conductive sheet and a second conductive sheet disposed on the top surface of the shell, the first conductive sheet contacting the light-transmitting conductive unit and the first conductive path, and the second conductive sheet contacting the light-transmitting conductive unit and the second conductive path.

* * * * *